(12) United States Patent
Nomura

(10) Patent No.: US 6,205,075 B1
(45) Date of Patent: Mar. 20, 2001

(54) SEMICONDUCTOR MEMORY DEVICE CAPABLE OF REDUCING THE EFFECT OF CROSSTALK NOISE BETWEEN MAIN BIT LINES AND VIRTUAL MAIN GROUNDING LINES

(75) Inventor: Kouichi Nomura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/551,777

(22) Filed: Apr. 18, 2000

(30) Foreign Application Priority Data

Apr. 20, 1999 (JP) .................................................. 11-112900

(51) Int. Cl.[7] ...................................................... G11C 7/02
(52) U.S. Cl. .................... 365/214; 365/206; 365/230.06; 365/103; 365/104; 365/185.16; 365/185.05
(58) Field of Search ..................................... 365/103, 104, 365/94, 185.16, 185.05, 230.06, 214, 206

(56) References Cited

U.S. PATENT DOCUMENTS 5,757,690 * 5/1998 McMahon ............................ 365/104
5,870,326 * 2/1999 Schuelein ............................... 365/94

* cited by examiner

Primary Examiner—Andrew Q. Tran
(74) Attorney, Agent, or Firm—Scully, Scott, Murphy & Presser

(57) ABSTRACT

This semiconductor memory device is provided with a plurality of main bit lines; a main bit line controller for controlling whether to impress a specific voltage on the main bit lines, connect the main bit lines to a sense amplifier, or place the main bit lines in the OPEN state, based on an address signal; a plurality of virtual main grounding lines; and a virtual main grounding line controller for controlling whether to impress a specific voltage on the virtual main grounding lines, impress a grounding voltage on the virtual main grounding lines, or place the virtual main grounding lines in the OPEN state, based on an address signal. The main bit line controller and the virtual main grounding line controller control the voltage impression states of the main bit lines and the virtual main grounding lines respectively, so that, when accessing a memory cell, the relative positional relationship of the voltage level states of the virtual main grounding lines and other main bit lines that are adjacent to and at specific intervals of space from the main bit line connecting the selected memory cell and the sense amplifier, will be the same for any memory cell selected.

20 Claims, 20 Drawing Sheets

| AD1 | AD0 | BS0 | BS1 | BS2 | BS3 | BS4 | BS5 |
|---|---|---|---|---|---|---|---|
| L | L | H | L | L | L | H | L |
| L | H | L | L | H | H | L | L |
| H | L | L | H | L | L | L | H |
| H | H | L | H | L | L | H | L |

TABLE 1

FIG.12

|    | BS0 | BS1 | BS2 | BS3 | BS4 | BS5 | BS6 | BS7 |
|----|-----|-----|-----|-----|-----|-----|-----|-----|
| M0 | H   | L   | L   | L   | H   | L   | L   | L   |
| M1 | L   | H   | L   | L   | L   | H   | L   | L   |
| M2 | L   | L   | H   | L   | L   | L   | H   | L   |
| M3 | L   | L   | L   | H   | L   | L   | L   | H   |

SEMICONDUCTOR MEMORY DEVICE CAPABLE OF REDUCING THE EFFECT OF CROSSTALK NOISE BETWEEN MAIN BIT LINES AND VIRTUAL MAIN GROUNDING LINES

BACKGROUND OF THE INVENTION

1. Field of the Invention

The present invention relates to a semiconductor memory device for carrying out high-speed read-out of data recorded in memory cells.

2. Description of the Related Art

In general, [0]/[1] binary information, or multi-value information expressed by the voltage level of a gate that employs threshold control to turn a transistor ON/OFF, can be stored in a single transistor in a semiconductor memory device such as a ROM (read only memory).

A plurality of memory cell transistors are formed to a matrix on the semiconductor substrate in the aforementioned semiconductor memory device. Word lines formed in patterns in the matrix rows are connected to a gate, while bit lines formed in patterns in matrix columns are connected to a drain.

When reading out data stored in the memory cells of this semiconductor memory device, the memory cell corresponding to the inputted address signal is selected according to which word and bit lines are activated by decoders. The data recorded in the memory cell corresponding to address is read out by comparing the current flowing to the selected memory cell transistor with the current flowing to a reference memory cell at a sense amplifier.

In the above-described semiconductor memory device, each memory cell transistor is formed to be isolated from the other memory cell transistors on the semiconductor substrate by use of an element separating film. The drain for the memory cell transistor is connected to the bit line, and the source is grounded.

A simple design may be employed for the circuitry required for read out in the semiconductor memory device design as described above. However, for each memory cell transistor, it is necessary to form a contact to the diffusion layer comprising the drain, this contact connecting the diffusion layer and the bit line to be wired. Because of this need to form a contract to the drain diffusion layer, a larger area must be employed for the diffusion layer than would otherwise be required in the transistor design. It therefore becomes difficult to increase the degree of integration in the memory cell transistor of the above-described design.

In order to resolve the deficits present in the structure of this memory cell transistor, it has become the practice to employ a virtual grounding type memory cell transistor design and arrangement that increases the degree of integration in the memory cell.

In other words, a design (sub-bit line, virtual sub-grounding line) is employed in which a common diffusion layer is used to form the drain and source for memory cell transistors that are adjacent to one another in a row, and these diffusion layers are connected in the columns. As a result, each diffusion layer is connected on the matrix, and it is no longer necessary to provide a contact to the area in which the memory cells are formed. Thus, the degree of integration in this memory cell transistor can be increased as compared to the case in which a contact is formed.

The conventional semiconductor memory device employing a virtual grounding type memory cell transistor design as described above will now be explained using FIGS. 13 and 14. FIG. 13 is a block diagram showing the structure of a conventional semiconductor memory device. FIG. 14 is a conceptual diagram showing the detailed structure of memory cell 16 in FIG. 13.

In FIG. 13, data is stored in memory cell transistors that form a memory cell area 16B in memory cell 16. An address AD is input from an external CPU (central processing unit) or the like, specifying a memory cell transistor within memory cell area 16B. The data stored in this memory cell transistor is then read out as a result.

Address buffer 11 performs waveform shaping of the inputted address signal AD, and, after holding the signal, outputs it to Y decoder 12, bank decoder 13, X decoder 4 and virtual GND selector 15. X decoder 4 decodes part of the plurality of bits in the address AD signal, and selects and activates one word line selection signal from among word line selection signal WD0~word line selection signal WDn. As a result, all the memory cell transistors in one row of the memory cell array in memory cell area 16B are selected together, and a data read out state is enabled.

Y decoder 12 decodes part of the plurality of bits in the address signal AD, and outputs Y decoder signal YD to Y selector 17. Based on the inputted Y decoder signal YD, Y selector 17 selects one main bit line from among main bit line D1~main bit line D1 that are connected to each memory cell transistor in memory cell 16.

As a result, a main bit line is connected to sense amplifier circuit 9, and a read out state is enabled for the memory cell transistor that corresponds to address signal AD. As a result, Y selector 17 inputs the data stored in this selected memory cell transistor via the main bit line, and outputs the data to sense amplifier circuit 9 as a data signal DG.

At this time, the memory cell transistor performs data storage by changing the threshold voltage, which is under ON/OFF control. In other words, when the threshold voltage is changed so that the word selection line that is connected to the gate is activated and the memory cell transistor enters the ON state, data is stored by means of the flow of current proportionate to this threshold value. In the case of binary information, two thresholds, i.e., a state in which current flows easily and a state in which current does not flow easily, are controlled.

Sense amplifier circuit 9 compares the current of this input data signal DG and the current of a reference signal RG that is input from reference circuit 10. If the current of data signal DG is smaller than the current of reference signal RG at this time for example, then the current state is one in which the threshold value is high and current does not readily flow. Therefore, the data stored in the memory cell transistor is [H]. Conversely, if the current of the data signal DG is larger than the current of the reference signal RG, then the data stored in the memory cell transistor is [L].

Next, sense amplifier circuit 9 outputs the results of this comparison of the currents as data signal D0.

Reference circuit 10 is formed of a constant voltage circuit (a voltage stabilizer) that outputs a voltage level which is intermediate between the voltage level of the bit signal when the data stored in the memory cell transistor in memory cell area 16B is [H], and the voltage level of the bit signal when the data stored in the memory cell transistor in memory cell area 16B is [L].

In addition, for example, reference circuit 10 may also have a design in which a reference transistor is employed that is controlled by a threshold value where the voltage level of reference signal RG, which is selected by the word selection line and determined by the current flow, assumes a voltage level that is intermediate between the bit signal voltage level when the data stored in the memory cell transistor is [H] and the bit signal voltage level when the data stored in the memory cell transistor is [L].

Precharge circuit 8 prevents the flow of current to memory cell transistors other than the one selected, by means of impressing a bias voltage onto the main bit lines that are connected to the non-selected memory cell transistors that are adjacent to the memory cell transistor within memory cell area 16B that was selected by the address signal AD.

The bias voltage supplied from precharge circuit 8 at this time is output as precharge signal PC to the main bit line that was selected by Y selector 17 in accordance with address signal AD.

Bank decoder 13 decodes a portion of address signal AD, and outputs bank selection signal BS0~bank selection signal BS3 as the decoded results to the bank selection signal lines corresponding respectively to bank selector 16A and bank selector 16C. Bank selection signal BS0 and bank selection signal BS1 are output to the bank selection signal line of bank selector 16A, while bank selection signal BS2 and bank selection signal BS3 are output to the bank selection signal line of bank selector 16C.

Based on address signal AD from address buffer 11, virtual GND selector 15 selects one virtual main grounding line from among virtual main grounding line V1~virtual main grounding line Vk that are connected to the memory cell transistors in memory cell array 16B, and designates this as the grounding potential GND. Virtual GND selector 15 supplies a specific bias voltage Vp (the same potential as that of the main bit line connected to sense amplifier circuit 9, for example) to the virtual main grounding lines that were not selected, or places these unselected virtual main grounding lines in the OPEN state. "OPEN state" as employed here means a state in which the line is not connected to voltage or current sources.

Next, memory cell 16 will be explained in detail using FIG. 14. FIG. 14 is a conceptual diagram showing the structure of memory cell 16, and excludes areas related to main bit line D1~main bit line D3 and virtual main grounding line V1~virtual main grounding line V3. In this figure, bank selector 16A is formed of MOS transistor BT00, MOS transistor BT01, MOS transistor BT10, MOS transistor BT11, MOS transistor BT20, and MOS transistor BT21. Similarly, bank selector 16C is formed of a MOS transistor BT02, MOS transistor BT03, MOS transistor BT12, MOS transistor BT13, MOS transistor BT22, and MOS transistor BT23.

The drain of MOS transistor BT00 and MOS transistor BT01 is connected to metal wire ML1 (main bit line D1) via a contact CT1. The gate of MOS transistor BT00 is connected to the bank selection signal line of bank selection signal BS0, and the source is connected to the source and the drain of a memory cell transistor in memory cell array 16B via sub-bit line B00. In addition, the gate of MOS transistor BT01 is connected to the bank selection signal line of bank selection signal BS1, and the source is connected to the source and the drain of a memory cell transistor in memory cell array 16B via sub-bit line B01.

The drain of MOS transistor BT10 and MOS transistor BT11 is connected to metal wire ML3 (main bit line D2) via contact CT3. The gate of MOS transistor BT10 is connected to the bank selection signal line of bank selection signal BS0, and the source is connected to the source and the drain of a memory cell transistor in memory cell array 16B via sub-bit line B10. The gate of MOS transistor BT11 is connected to the bank selection signal line of bank selection signal BS1, and the source is connected to the source and the drain of a memory cell transistor in memory cell array 16B via sub-bit line B11.

The drain of MOS transistor BT20 and MOS transistor BT21 is connected to metal wire ML5 (main bit line D3) via a contact CT5. The gate of MOS transistor BT20 is connected to the bank selection signal line of bank selection signal BS0, and the source is connected to the source and the drain of a memory cell transistor in memory cell array 16B via sub-bit line B20. In addition, the gate of MOS transistor BT21 is connected to the bank selection signal line of bank selection signal BS1, and the source is connected to the source and the drain of a memory cell transistor in memory cell array 16B via sub-bit line B21.

The source of MOS transistor BT02 and MOS transistor BT03 is connected to metal wire ML0 (virtual main grounding line V1) via contact CT0. The gate of MOS transistor BT02 is connected to the bank selection signal line of bank selection signal BS2, and the drain is connected to the source and the drain of a memory cell transistor in memory cell array 16B via virtual sub-grounding line B02. The gate of MOS transistor BT03 is connected to the bank selection signal line of bank selection signal BS3, and the source is connected to the source and drain of a memory cell transistor in memory cell array 16B via virtual sub-grounding line B03.

The source of MOS transistor BT12 and MOS transistor BT13 is connected to metal wire ML2 (virtual main grounding line V2) via contact CT2. The gate of MOS transistor BT12 is connected to the bank selection signal line of bank selection signal BS2, and the drain is connected to the source and drain of a memory cell transistor in memory cell array 16B via virtual sub-grounding line B12. The gate of MOS transistor BT13 is connected to the bank selection signal line of bank selection signal BS3, and the source is connected to the source and drain of a memory cell transistor in memory cell array 16B via virtual sub-grounding line B13.

The source of MOS transistor BT22 and MOS transistor BT23 is connected to metal wire ML4 (virtual main grounding line V4) via contact CT4. The gate of MOS transistor BT22 is connected to the bank selection signal line of bank selection signal BS2, and the drain is connected to the source and drain of a memory cell transistor in memory cell array 16B via virtual sub-grounding line B22. The gate of MOS transistor BT23 is connected to the bank selection signal line of bank selection signal BS3, and the source is connected to the source and drain of a memory cell transistor in memory cell array 16B via virtual sub-grounding line B23.

Next, patterns will be shown for the potential that is impressed on main bit line D1~main bit line D3, and virtual main grounding line V1~virtual main grounding line V3 during respective reading out of memory cell transistor M0, memory cell transistor M1, memory cell transistor M2, and memory cell transistor M3 in a conventional semiconductor memory device.

When reading out data stored in any one of the memory transistors in memory cell array 16B, one of the following four impression potential patterns results.

The memory cell transistors and MOS transistors will all be explained below as n channel MOS transistors.

a. First Impression Pattern (Read Out of Memory Cell Transistor M0)

In order to sense the current flowing to memory cell transistor M0, the following impression pattern is employed so that current does not flow to other memory cell transistors from the metal wire ML3 (main bit line D2) that is connected to sense amplifier circuit 9.

For example, as shown in FIG. 15, in accordance with the data in address AD for selecting cell transistor M0 and based on Y decoder signal YD input from Y decoder 12, Y selector 17 places metal wire ML1 (main bit line D1) in the OPEN state, thereby connecting metal wire ML3 (main bit line D2) and sense amplifier circuit 9. In addition, similarly, the Y selector impresses a specific bias voltage Vp onto metal wire ML5 (main bit line D3) based on Y decoder signal YD.

In accordance with the data in address AD for selecting cell transistor M0, virtual GND selector 15 places metal wire ML0 (virtual main grounding line V1) in the OPEN state, designates metal wire ML2 (virtual main grounding line V2) as grounding potential GND, and sets metal wire ML4 (virtual main grounding line V3) to a specific bias voltage Vp.

Next, in accordance with the data in address AD for selecting cell transistor M0, bank decoder 13 sets bank selection signal BS0 and bank selection signal BS2 to [H] level. As a result, MOS transistor BT00, MOS transistor BT10, MOS transistor BT21, MOS transistor BT02, MOS transistor BT12, and MOS transistor BT22 enter the ON state.

As a result, the drain of memory cell transistor M0 is connected to metal wire ML3 (main bit line D2) via MOS transistor BT10. The source of memory cell transistor M0 is connected to metal wire ML2 (virtual main grounding line V2 which assumes grounding potential GND) via MOS transistor BT12.

Next, in accordance with the data in address AD for selecting cell transistor M0, X decoder 4 sets word line WD2 to [H] level. As a result, all memory cell transistors for which the gate is connected to word line WD2 enter the ON state, these including memory cell transistor M0, memory cell transistor M1, memory cell transistor M2, and memory cell transistor M3.

However, the source and drain of the memory cell transistor which is connected to the source of memory cell transistor M0, i.e., the memory cell transistor which is positioned to the left of virtual sub-grounding line B12 to which metal wire ML2 (virtual main grounding line V2), forming grounding potential GND, is connected, is placed in the OPEN state. For this reason, current flows via virtual sub-grounding line B12 from the source of memory cell transistor M0 to metal wire ML2 (virtual main grounding line V2) only.

In addition, the source and drain of the memory cell transistor which is connected to the drain of memory cell transistor M0, i.e., the memory cell transistor which is positioned to the right of sub-bit line B10 to which metal wire ML3 (main bit line D2), connected to sense amplifier circuit 9, is connected, becomes a specific potential Vp. For this reason, current from the metal wire ML2 connected to sense amplifier circuit 9 flows into the drain of memory cell transistor M0 only.

As explained above, in accordance with the data in address AD for selecting memory cell transistor M0, Y decoder 12, bank decoder 13, Y selector 17 and virtual GND selector 15 carry out processing so that the current from sense amplifier circuit 9 flows only to memory cell transistor M0. As a result, the data stored in memory cell transistor M0 is accurately read out.

b. Second Impression Pattern (Read Out of Memory Cell Transistor M1)

In order to sense the current flowing to memory cell transistor M1, the following impression pattern is established so that current does not flow to other memory cell transistors from the metal wire ML3 (main bit line D2) which is connected to sense amplifier circuit 9.

For example, as shown in FIG. 16, in accordance with the data in address AD for selecting cell transistor M1 and based on Y decoder signal YD input from Y decoder 12, Y selector 17 places metal wire ML5 (main bit line D3) in the OPEN state, and connects metal wire ML3 (main bit line D2) and sense amplifier circuit 9. In addition, similarly, the Y selector impresses a specific bias voltage Vp onto metal wire ML1 (main bit line D1) based on Y decoder signal YD.

Then, in accordance with the data in address AD for selecting cell transistor M1, virtual GND selector 15 places metal wire ML4 (virtual main grounding line V3) in the OPEN state, designates metal wire ML2 (virtual main grounding line V2) as the grounding potential GND, and sets metal wire ML0 (virtual main grounding line V1) to a specific bias voltage Vp.

In accordance with the data in address AD for selecting cell transistor M1, bank decoder 13 sets bank selection signal BS0 and bank selection signal BS3 to [H] level. As a result, MOS transistor BT00, MOS transistor BT10, MOS transistor BT20, MOS transistor BT03, MOS transistor BT13 and MOS transistor BT23 are placed in the ON state.

As a result, the drain for memory cell transistor M1 is connected to metal wire ML3 (main bit line D2) via MOS transistor BT10. In addition, the source of memory cell transistor M1 is connected to metal wire ML2 (virtual main grounding line V2 which becomes grounding potential GND) via MOS transistor BT13.

Next, X decoder 4 sets word line WD2 to [H] level in accordance with the data in address AD for selecting cell transistor M1. As a result, all memory cell transistors for which the gate is connected to word line WD2 enter the ON state, these including memory cell transistor M0, memory cell transistor M1, memory cell transistor M2 and memory cell transistor M3.

However, the source and drain for the memory cell transistor positioned to the right of virtual sub-grounding line B13 which is connected to the source of memory cell transistor M1, i.e., to which metal wire ML2 (virtual main grounding line V2), forming grounding potential GND, is connected, enter the OPEN state. For this reason, current flows from the source of memory cell transistor M1 via virtual sub-grounding line B13 into metal wire ML2 (virtual main grounding line V2) only.

The source and drain for the memory cell transistor positioned to the left of sub-bit line B10 which is connected to the drain of memory cell transistor M1, i.e., to which metal wire ML3 (main bit line D2), connected to sense amplifier circuit 9, is connected, become a specific potential Vp. For this reason, the current that flows from metal wire ML3 (main bit line D2) that is connected to sense amplifier circuit 9 flows into the drain of memory cell transistor M1 only.

As described above, in accordance with the data in address AD for selecting memory cell transistor M1, Y decoder 12, bank decoder 13, Y selector 17 and virtual GND selector 15 operate so that the current from sense amplifier circuit 9 flows into memory cell transistor M1 only. As a result, the data stored in memory cell transistor M1 can be accurately read out.

c. Third Impression Pattern (Read Out of Memory Cell Transistor M2)

In order to sense the current flowing to memory cell transistor M2, the following impression pattern is established so that current does not flow to other memory cell transistors from metal wire ML3 (main bit line D2) that is connected to sense amplifier circuit 9.

As shown in FIG. 17 for example, the voltage impression pattern between main bit line D1~main bit line D3 and virtual main grounding line V1~virtual main grounding line V3 is equivalent to the second impression pattern shown in FIG. 2. Accordingly, an explanation thereof will be omitted.

Then, in accordance with the data in address AD for selecting cell transistor M2, bank decoder 13 sets the bank selection signal BS1 and bank selection signal BS3 to [H] level. As a result, MOS transistor BT01, MOS transistor BT11, MOS transistor BT21, MOS transistor BT03, MOS transistor BT13 and MOS transistor BT23 are placed in the ON state.

As a result, the drain for memory cell transistor M2 is connected to metal wire ML3 (main bit line D2) via MOS transistor BT11. In addition, the source of memory cell transistor M2 is connected to metal wire ML2 (virtual main grounding line V2 which assumes grounding potential GND) via MOS transistor BT13.

Next, X decoder 4 sets word line WD2 to [H] level in accordance with the data in address AD for selecting cell transistor M2. As a result, all memory cell transistors for which the gate is connected to word line WD2 are placed in the ON state, these including memory cell transistor M0, memory cell transistor M1, memory cell transistor M2 and memory cell transistor M3.

However, the source and drain for the memory cell transistor positioned to the left of virtual sub-grounding line B13 which is connected to the memory cell transistor M2 source, i.e., to which metal wire ML2 (virtual main grounding line V2), which becomes the grounding potential GND, is connected, enter the OPEN state. For this reason, the current flows via virtual sub-grounding line B13 from the source of memory cell transistor M1 into metal wire ML2 (virtual main grounding line V2) only.

The source and drain for the memory cell transistor positioned to the right of sub-bit line B11 which is connected to the drain of memory cell transistor M2, i.e., to which metal wire ML3 (main bit line D2), connected to sense amplifier circuit 9, is connected, become a specific potential Vp. For this reason, the current that flows from metal wire ML3 (main bit line D2), which is connected to sense amplifier circuit 9, flows into the drain of memory cell transistor M2 only.

As described above, in accordance with the data in address AD for selecting memory cell transistor M2, Y decoder 12, bank decoder 13, Y selector 17 and virtual GND selector 15 operate so that the current from sense amplifier circuit 9 flows into memory cell transistor M2 only. As a result, the data stored in memory cell transistor M2 is accurately read out.

d. Fourth Impression Pattern (Read Out of Memory Cell Transistor M3)

In order to sense the current flowing to memory cell transistor M3, the following impression pattern is established so that current does not flow to other memory cell transistors from metal wire ML3 (main bit line D2) that is connected to sense amplifier circuit 9.

For example, as shown in FIG. 18, based on Y decoder signal YD input from Y decoder 12 in accordance with the data in address AD for selecting cell transistor M3, Y selector 17 places metal wire ML5 (main bit line D3) in the OPEN state, and connects metal wire ML3 (main bit line D2) and sense amplifier circuit 9. In addition, similarly, the Y sector impresses a specific bias voltage Vp onto metal wire ML1 (main bit line D1) based on Y decoder signal YD.

Then, in accordance with the data in address AD for selecting cell transistor M3, virtual GND selector 15 places metal wire ML0 (virtual main grounding line V1) in the OPEN state, designates metal wire ML4 (virtual main grounding line V3) as grounding potential GND, and sets metal wire ML2 (virtual main grounding line V2) to a specific bias voltage Vp.

In accordance with the data in address AD for selecting cell transistor M3, bank decoder 13 sets bank selection signal BS1 and bank selection signal BS2 to [H] level. As a result, MOS transistor BT01, MOS transistor BT11, MOS transistor BT21, MOS transistor BT02, MOS transistor BT12 and MOS transistor BT22 enter the ON state.

As a result, the drain for memory cell transistor M3 is connected to metal wire ML3 (main bit line D2) via MOS transistor BT11. In addition, the source of memory cell transistor M3 is connected to metal wire ML4 (virtual grounding line V3 which becomes grounding potential GND) via MOS transistor BT12.

Next, X decoder 4 sets word line WD2 to [H] level in accordance with address AD data for selecting cell transistor M3. As a result, all memory cell transistors for which the gate is connected to word line WD2 are placed in the ON state, these including memory cell transistor M0, memory cell transistor M1, memory cell transistor M2 and memory cell transistor M3.

However, the source and drain for the memory cell transistor positioned to the right with respect to virtual sub-grounding line B22 which is connected to the source of memory cell transistor M3, i.e., to which metal wire ML4 (virtual main grounding line V3), which becomes the grounding potential GND, is connected, are placed in the OPEN state. For this reason, current flows from the source of memory cell transistor M3 via virtual sub-grounding line B22 to metal wire ML4 only.

The source and drain for the memory cell transistor positioned to the left of sub-bit line B11 which is connected to the drain of memory cell transistor M3, i.e., to which metal wire ML3 (main bit line D2), connected to sense amplifier circuit 9, is connected, become a specific potential Vp. For this reason, the current that flows from metal wire ML3 (main bit line D2) which is connected to sense amplifier circuit 9 flows into the drain of memory cell transistor M3 only.

The source and the drain for the memory cell transistor that is positioned to the left with respect to sub-bit line B01 to which metal wire ML1 (main bit line D1) is connected enter the OPEN state. Accordingly, current does not flow from metal wire ML1 (main bit line D1).

As described above, in accordance with address AD data for selecting memory cell transistor M3, Y decoder 12, bank decoder 13, Y selector 17 and virtual GND selector 15 operate so that the current from sense amplifier circuit 9 flows into memory cell transistor M3 only. As a result, the data stored in memory cell transistor M3 is accurately read out.

However, crosstalk noise may or may not be superimposed on metal wire ML3 (main bit line D2) in the above-described semiconductor memory device impression patterns, depending upon the voltage impression states of metal wire ML4 and metal wire ML2 which are adjacent to the metal wire ML3 (main bit line D2) that is connected to and being sensed by sense amplifier circuit 9.

Such presence and absence of crosstalk noise causes the negative effect of delaying the access time. This is because time is required for the output from sense amplifier circuit 9 to become the actual data stored in the memory cell transistor, and this time depending upon the voltage level setting for the reference signal RG that is supplied from reference circuit 10 to sense amplifier circuit 9. (In other words, the voltage level of the reference signal RG should be set in consideration of crosstalk noise, so that the access time is delayed if the voltage level is not set appropriately.)

Reference transistors are provided within reference circuit 10 for each of word selection line WD1~word selection line WDn which have the same design as the memory cell transistors inside memory cell array 16B (see FIG. 13). Threshold values are adjusted in these reference transistors so that, when ON, the output from bias circuit 101 assumes a potential level that is intermediate for the memory cell transistors inside memory cell array 16B in which [H] and [L] data are stored.

The source of this reference transistor is grounded, and its drain is connected to sense amplifier circuit 9. Reference signal RG is output to sense amplifier circuit 9. In addition, in order to provide the reference transistor source and drain with the same characteristics as the memory cell transistor of memory cell array 16B, it is acceptable to insert a MOS transistor for forming Y selector 17, bank selector 16A, bank selector 16C and virtual GND selector 15.

Next, test results using a simulation (SPICE: Simulation Program with Integrated Circuit Emphasis) will be used to explain the reason why the access time is delayed due to crosstalk noise on metal wire ML3 (main bit line D2) from adjacent metal wire ML2 and metal wire ML4.

The voltage amplifying circuit to which metal wire ML3 (main bit line D2) is connected by Y selector 17 that is employed in this simulation will be explained using FIG. 19. FIG. 19 is a circuit diagram showing the structure of bias circuit 100 that is provided inside sense amplifier circuit 9 (see FIG. 13).

In this figure, M1 is a p-channel MOS transistor in which the source is connected to a power source Vcc. The gate is connected to terminal T1 and the drain is connected to the source of MOS transistor M2.

MOS transistor M2 is a p-channel MOS transistor. The gate is connected to terminal T3 and the drain is connected to the drain of MOS transistor M3. MOS transistor M3 is an n-channel MOS transistor. The gate is connected to terminal T3 and the source is grounded. M4 is an n-channel MOS transistor in which the source is grounded. The gate is connected to terminal T1 and the drain is connected to the drain of the MOS transistor M3.

M5 is a p-channel MOS transistor. The source is connected to electric source Vcc, and the gate and drain are connected to terminal T2. M6 is an n-channel MOS transistor. The drain is connected to terminal T3, the gate is connected to the drain of MOS transistor M3, and the source is connected to terminal T3.

When control signal SEB input from terminal T1 is at [H] level, MOS transistor M1 enters the OFF state and MOS transistor M4 enters the ON state. As a result, signal S becomes [L] level. Accordingly, MOS transistor M6 enters the OFF state, and the main bit line connected via Y selector 17 enters an OPEN state with sense amplifier circuit 9. Accordingly, the output signal Dout that is output from terminal T2 becomes [H] level (electric source Vcc).

In contrast, when control signal SEB input from terminal T1 is at [L] level, MOS transistor M1 enters the ON state and MOS transistor M4 enters the OFF state. As a result, signal S becomes [H] level. Accordingly, MOS transistor M6 enters the ON state, and the main bit line connected via Y selector 17 is connected to sense amplifier circuit 9. Accordingly, with regard to the output signal Dout that is output from transistor terminal T2, an output signal Vout having a voltage in accordance with the threshold of the memory cell transistor that is connected to the main bit line that is connected via Y selector 17 is output to a differential amplifying circuit.

At the same time, inside reference circuit 10, the reference transistor in which a word selection line in the same row as the memory cell transistor selected corresponding to address signal AD is connected to the gate, enters the ON state. Reference signal DG is input into another bias circuit 101 that has the same structure as bias circuit 100 inside sense amplifier circuit 9. The differential amplifying circuit provided within sense amplifier circuit 9 compares voltage Vd of output signal Dout outputted by bias circuit 100 and the amplified voltage level of reference signal DG from reference circuit 10 that was output from the other bias circuit 101.

An [H]/[L] detection of the data stored in the memory transistor is performed in the results of this comparison. For example, when voltage Vd is larger than the voltage level of the output from the other bias circuit 101, then the data stored in the memory cell transistor is [H]. Conversely, when voltage Vd is smaller than the voltage level of the output from the other bias circuit 101, then the data stored in the memory cell transistor is [L].

Accordingly, if a simulation is performed of the relative relationship over time between this voltage Vd and the voltage level of reference signal DG, then a judgment can be made of the extent to which crosstalk noise from adjacent metal wire ML2 and metal wire ML4 is effecting metal wire ML3 (main bit line D2).

Next, a diagram of the results of the simulation will be used to explain the action for reading out the data stored in a conventional semiconductor memory device memory cell transistor. The explanation will be carried out referring to FIGS. 13, 14 and 19 in sequence. FIG. 20 is a diagram showing the results obtained when the action for reading out the data stored in the memory cell transistor is simulated using SPICE. In this figure, the voltage level is shown on the vertical axis, while time is shown on the horizontal axis (where 1 dot=1 ns).

In this figure, line L2 shows the voltage level of output signal Dout from bias circuit 100 in the data read out from a memory cell transistor in which [H] data is stored, when the voltage impression pattern on metal wire ML0~metal wire ML5 shown in FIGS. 15, 17, and 18 is voltage impression pattern 1. Line L1 shows the voltage level of output signal Dout from bias circuit 100 in the data read out from a memory cell transistor in which [H] data is stored, when the voltage impression pattern on metal wire ML0~metal wire ML5 shown in FIG. 16 is voltage impression pattern 2.

Line LA shows the voltage level of output signal Dout from bias circuit 100 in the data read out from a memory cell transistor in which [L] data is stored, when the voltage impression pattern on metal wire ML0~metal wire ML5 shown in FIGS. 15, 17, and 18 is voltage impression pattern 1. Line L3 shows the voltage level of output signal Dout from bias circuit 100 in the data read out from a memory cell transistor in which [L] data is stored, when the voltage impression pattern on metal wire ML0~metal wire ML5 shown in FIG. 16 is voltage impression pattern 2.

Similarly, line L2 shows the voltage level of metal wire ML3 (main bit line D2) that is connected to a memory cell transistor in which [H] data is stored, when the voltage impression pattern on metal wire ML0~metal wire ML5 shown in FIGS. 15, 17 and 18 is voltage impression pattern 1.

Line L4 shows the voltage level of metal wire ML3 (main bit line D2) that is connected to a memory cell transistor in which [L] data is stored, when the voltage impression pattern on metal wire ML0~metal wire ML5 shown in FIGS. 15, 17 and 18 is voltage impression pattern 1. Line L3 shows the voltage level of metal wire ML3 (main bit line D2) that is connected to a memory cell transistor in which [L] data is stored, when the voltage impression pattern on metal wire ML0~metal wire ML5 shown in FIG. 16 is voltage impression pattern 2.

At time t10 (210 ns), address signal AD is input from an external circuit, and sense amplifier circuit 9 and a precharge circuit are activated by the signal from an address signal detecting circuit not shown in the figures. In other words, the control signal SEB input from an address signal detecting circuit, not shown in the figures, to terminal T1 of the aforementioned bias circuit 100 (FIG. 19) in sense amplifier circuit 9, becomes [L] level, and a specific bias voltage Vp is output to Y selector 17 via terminal T3. Similarly, precharge circuit 8 outputs a precharge signal PC to the Y selector.

Next, at time t11 (215 ns), Y decoder 12 decodes the address signal AD that was inputted and held in address buffer 11, and outputs Y selector signal YG to Y selector 17. Y selector 17 reads out memory cell transistor M0, for example, based on the input Y selector signal YG, and, as shown by the voltage impression pattern on metal wire ML0~metal wire ML5 in FIG. 15, initiates a charge by providing a specific bias voltage Vp from sense amplifier circuit 9 to metal wire ML3 (main bit line D2), and initiates a charge by applying the precharge signal PC from precharge circuit 8 onto metal wire ML5 (main bit line D3). As a result, metal wire ML1 (main bit line D1) is placed in the OPEN state.

Similarly, based on input address signal AD, virtual GND selector 15 initiates a charge by applying a specific bias voltage Vp to metal wire ML4 (virtual main grounding line V3), and grounds metal wire ML2 (virtual main grounding line V2), for example, as shown by the voltage impression pattern on metal wire ML0~metal wire ML5 in FIG. 15. As a result, metal wire ML0 (virtual main grounding line V1) is placed in the OPEN state. As a result, metal wire ML3 (main bit line D2) is adjacent to metal wire ML2 (virtual main grounding line V2), which has a specific bias voltage Vp, and grounded metal wire ML4 (virtual main grounding line V3) (first impression pattern, third impression pattern, and fourth impression pattern).

As a result, the voltage levels of line L1~line L4, i.e., the potential of metal wire ML3 (main bit line D2), start to rise. Simultaneously, the voltage level of line L1~line L4, i.e., the voltage level of the output signal Dout outputted from bias circuit 100, gradually decreases since current is supplied to metal wire ML3 (main bit line D2).

Next, at time t12 (218 ns), based on address signal AD, bank recoder 13 outputs bank selection signal BS0 and bank selection signal BS2 to bank selector 16A at [H] level, and outputs bank selection signal BS1 and bank selection signal BS3 at [L] level to bank selector 16C.

As a result, metal wire ML0 (virtual main grounding line V1) is connected to virtual sub-grounding line B02, metal wire ML1 (main bit line D1) is connected to sub-bit line B00, metal wire ML2 (virtual main grounding line V2) is connected to virtual sub-grounding line B12, metal wire ML3 (main bit line D2) is connected to sub-bit line B10, metal wire ML4 (virtual main grounding line V3) is connected to virtual sub-grounding line B22, and metal wire ML5 (main bit line D3) is connected to sub-bit line B20. The precharge on metal wire ML3 (main bit line D2) from bias circuit 100 is terminated, and the voltage level of output signal Dout and the voltage level of metal wire ML3 (main bit line D2) starts to rise due to the supply of current from electrical source Vcc.

Next, at time t13 (222 ns), based on address signal AD, X decoder 4 sets the word selection line WD2 to [H] level. Memory cell transistor M0 is selected and the data stored in memory cell transistor M0 is read out. Bias circuit 100 shows the change in line L1 if [H] data is written in the memory cell transistor, and shows the change in line L3 if [L] data is written in the memory cell transistor.

Next, at time t14 (231 ns), a comparison with the reference voltage level is enabled at a differential amplifying circuit in sense amplifier circuit 9. In other words, this differential amplifying circuit begins sensing the current flowing to memory cell transistor M0. As a result, the [H]/[L] detection of the data stored in memory cell transistor M0 is enabled.

Next, at time t15 (236 ns), the voltage level of reference signal RG and the voltage level of metal wire ML3 (main bit line D2) assume a difference at which a comparison is possible. Sense amplifier circuit 9 outputs the results of the [H]/[L] detection for the data stored in memory cell transistor M0. In FIG. 20, time t15 is [236 ns].

Next, when reading out memory cell transistor M1, a charge is initiated by applying a specific bias voltage Vp from sense amplifier circuit 9 to metal wire ML3 (main bit line D2), and a charge is initiated by applying the precharge signal PC from precharge circuit 8 to metal wire ML1 (main bit line D1), as shown by the voltage impression pattern on metal wire ML0~metal wire ML5 in FIG. 16. As a result, metal wire ML5 (main bit line D3) is placed in the OPEN state.

Similarly, based on the input address signal AD, virtual GND selector 15 initiates a charge by applying a specific bias voltage Vp to metal wire ML0 (virtual main grounding line V1), and grounds metal wire ML2 (virtual main grounding line V2), for example, as shown by the voltage impression pattern on metal wire ML0~metal wire ML5 in FIG. 16. Metal wire ML4 (virtual main grounding line V3) is thereby placed in the OPEN state. As a result, metal wire ML3 (main bit line D2) is adjacent to metal wire ML4 (virtual main grounding line V3), which is OPEN, and metal wire ML2 (virtual main grounding line V2), which is grounded (second impression pattern).

At time t3 (222 ns), based on address signal AD, X decoder 4 sets the word selection line WD2 to [H] level. Memory cell transistor M1 is selected and the data stored in memory cell transistor M1 is read out. The output signal Dout of bias circuit 100 shows the change in line L2 assuming [H] data is written in the memory cell transistor, and shows the change in line L4 assuming [L] data is written.

In the second impression pattern in FIG. 20, metal wire ML4 (virtual main grounding line V3) which is adjacent to metal wire ML3 (main bit line D2), is in the OPEN state, and metal wire ML2 (virtual main grounding line V2) is grounded. As a result, metal wire ML3 (main bit line D2) is not affected by crosstalk noise from its neighboring metal wire. Thus, the output of bias circuit 100 assumes the change shown by line L3 if [L] data has been written in, and assumes the change shown by line L1 if [H] data has been written in.

Conversely, in the first, third and fourth impression patterns in FIG. 20, metal wire ML4 (virtual main grounding line V3), which is adjacent to metal wire ML3 (main bit line D2), is at a specific bias voltage Vp, and metal wire ML2 (virtual main grounding line V2) is grounded. For this reason, metal wire ML3 (main bit line D2) is affected by crosstalk from the adjacent metal wire ML4 (virtual main grounding line V3), and assumes the change shown by line L4 if [L] data is written in and the change shown by line L2 if [H] data is written.

Area ZM in FIG. 20 has been enlarged and is shown in FIG. 21 in order to facilitate understanding of the change over time in metal wire ML3 (main bit line D2) when [L] data and when [H] data are written in, in the first, third and fourth impression patterns, and in the second impression pattern, respectively. Voltage is shown on the vertical axis and time is shown on the horizontal axis.

In this figure, line L2 shows the change over time in metal wire ML3 (main bit line D2) when [H] data is written in in the first, third and fourth impression patterns. Line L1 shows the change in time in metal wire ML3 (main bit line D2) when [H] data is written in in the second impression pattern.

Line L4 shows the change over time in metal wire ML3 (main bit line D2) when [L] data is written in in the first, third and fourth impression patterns. Line L3 shows the change over time in metal wire ML3 (main bit line D2) when [L] data is written in in the second impression pattern.

In other words, in FIG. 21, when the potential of metal wire ML3 (main bit line D2) is rising, the adjacent metal wire ML4 (virtual main grounding line V3) also rises toward the specific bias voltage Vp. Thus, due to the coupling capacity between metal wire ML3 (main bit line D2) and metal wire ML4 (virtual main grounding line V3), a mutual crosstalk noise effect results. For this reason, the output of bias circuit 100 becomes a value that is elevated as a result of the crosstalk noise effect on metal wire ML3 (main bit line D2). Thus, the value shown by line LL2 and line LL4 assumes a high value with respect to line LL1 and line LL3 for the first impression pattern, third impression pattern and fourth impression pattern respectively. As a result, the output signal Dout of bias circuit 100 is affected by crosstalk noise, and assumes the result shown in FIG. 20.

Accordingly, in the conventional semiconductor memory device, the voltage change in metal wire ML3 (main bit line D2) differs between the first, third, and fourth impression patterns and the second impression pattern. For this reason, it is not possible to simply set the reference voltage level output from bias circuit 101 to a value that is intermediate between the case where the data stored in the memory cell transistor is [H] and the case where the data stored in the memory cell transistor is [L]. As a result, the conventional semiconductor memory device has a disadvantage in that a fast read out access time cannot be achieved if an optimal value is not set for all the output states of bias circuit 100.

The reference optimal value that is output by bias circuit 101 at this time is in between line L1 in which [H] is the minimum value for the data stored in the memory cell transistor and line L4 in which [L] is the maximal value for the data stored in the memory cell transistor. However, because the threshold value of the reference transistor formed by reference circuit 10 deviates because of effects imparted during the manufacturing process, the potential difference between line L1 and line L4 when a comparison state is enabled at sense amplifier circuit 9 is not a large value. Accordingly, the margin for setting the reference intermediate between line L1 and line L4 is extremely small.

In the conventional semiconductor memory device described above, the voltage level of reference signal RG from reference circuit 10 is set to a value that can correspond to the voltage of output signal Dout of bias circuit 100 based on the voltage level of signal DG metal wire ML3 (main bit line D2) for both the case of the first, third and fourth impression patterns, and the case of the second impression pattern.

For this reason, in the conventional semiconductor memory device, the access time for read out from the memory cell transistor in which the same data is stored differs between the first, third and fourth impression patterns, and the second impression pattern. Thus, the conventional semiconductor memory device is problematic in that the least optimal value from among the plurality of access times becomes the access time for the semiconductor memory device.

In addition, in the conventional semiconductor memory device, the voltage level of reference signal RG corresponds to a plurality of states for metal wire ML3 (main bit line D2), so that the aforementioned access time differs greatly depending on the threshold voltage of the transistor that determines the values of the data stored in the memory cell transistor. Accordingly, the deviation in the threshold values of the memory cell transistor also causes a reduction in the margin for setting the reference voltage level.

SUMMARY OF THE INVENTION

The present invention was conceived in consideration of the above-described circumstances, and has as its objective the provision of a semiconductor memory device in which the change in the voltage level of the main bit line that is connected to the sense amplifier is the same for any memory cell selected, and the margin for the reference voltage setting is increased, so that the access time improves as a result.

In order to achieve this objective, the present invention is provided with a plurality of main bit lines; a main bit line controller for controlling whether to impress a specific voltage on the main bit lines, connect the main bit lines to a sense amplifier, or place the main bit lines in the OPEN state, based on an address signal; a plurality of virtual main grounding lines; and a virtual main grounding line controller for controlling whether to impress a specific voltage on the virtual main grounding lines, impress a grounding voltage on the virtual main grounding lines, or place the virtual main grounding lines in the OPEN state, based on an address signal; wherein, when accessing the memory cell, the main bit controller and the virtual main grounding line controller control the voltage impression states of the main bit lines and the virtual main grounding lines respectively, so that the relative positional relationships between the voltage levels of the virtual main grounding lines and the other main bit lines, which are adjacent to and spaced at specific intervals from the main bit line that connects the selected memory cell and the sense amplifier, are equivalent for any memory cell selected.

Accordingly, when accessing a memory cell in the present invention, the voltage impression states of the main bit lines and the virtual main grounding lines are controlled so that the voltage level states of the virtual main grounding lines and the other main bit lines, which are adjacent to and spaced at specific intervals from the main bit line that connects the selected memory cell and the sense amplifier, is equivalent for any memory cell selected. Thus, the crosstalk noise effect is imparted in the same way in every case, so that the voltage change in the main bit lines becomes constant. For this reason, the voltage of the reference signal supplied from the reference circuit can be set to a value that is in the center of the main bit line voltage when [H] level data and [L] level data in the memory cells are read out. As a result, the margin for setting the voltage of the reference signal is not decreased as occurs in the conventional example due to the fact the voltage impression patterns for adjacent virtual main grounding lines differ. Accordingly, it is possible to realize a faster access time for data read out.

BRIEF DESCRIPTION OF THE DRAWINGS

FIG. 12 is a table showing a truth table for the actions of bank decoder 23 shown in FIG. 10.

DESCRIPTION OF THE PREFERRED EMBODIMENTS

Figure 1:
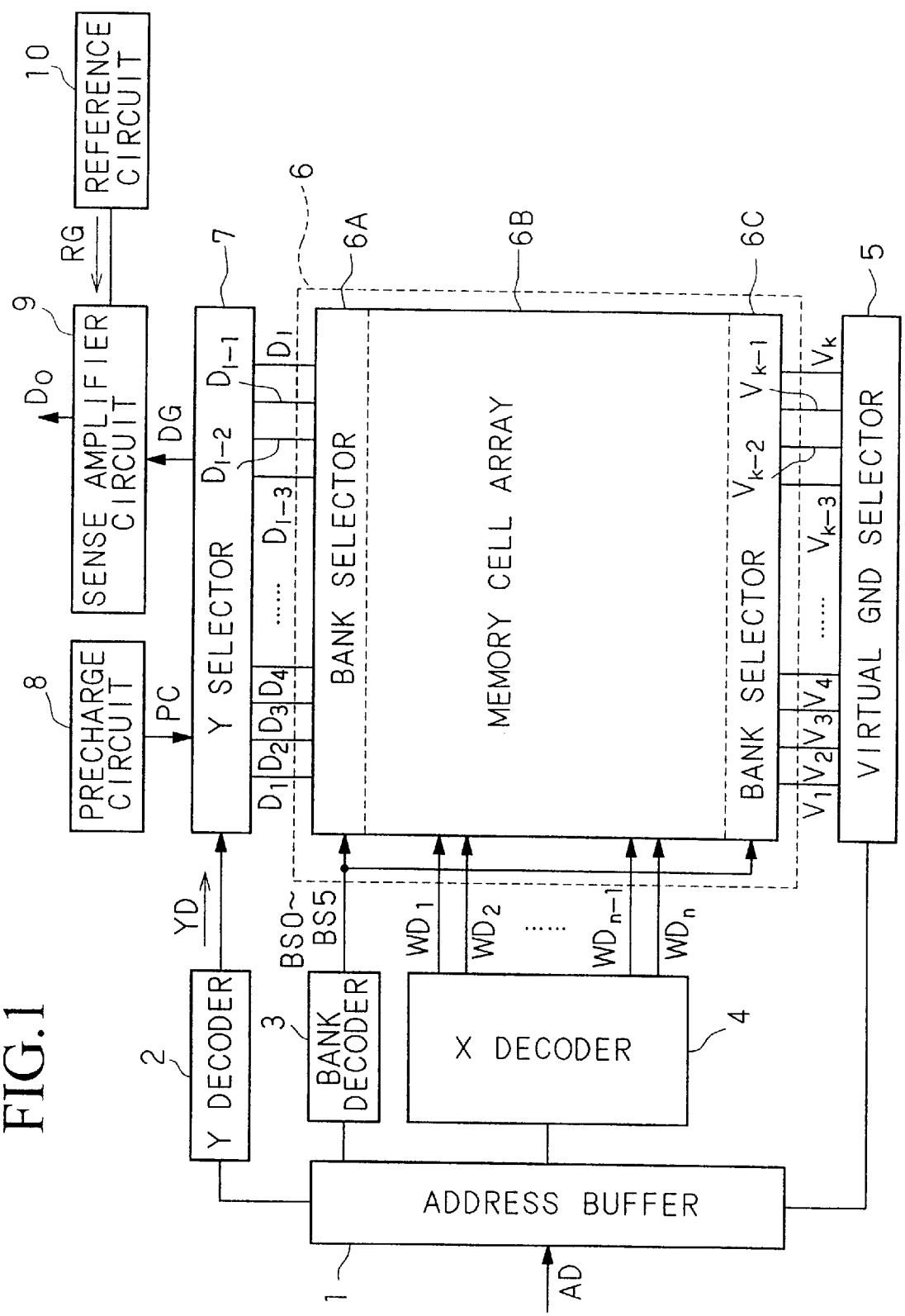
FIG. 1 is a block diagram showing the structure of the semiconductor memory device according to a first embodiment of the present invention.

Preferred embodiments of the present invention will now be explained with reference to the figures. FIG. 1 is a block diagram showing the structure of a semiconductor memory device according to a first embodiment of the present invention. In this figure, the data is stored in a memory cell transistor that forms memory cell area 6B in memory cell 6. An address AD is input from an external CPU (central processing unit) for specifying the memory cell transistor in this memory cell area 6B and reading out the data stored in this memory cell transistor.

Address buffer 1 performs waveform formation on the input address signal AD, holds this address signal AD, and then outputs the signal to Y decoder 2, bank decoder 3, X decoder 4 and virtual GND selector 5. X decoder 4 decodes a portion of the plurality of bits of address signal AD, and selects and activates one of the word line selection signals from among word line selection signal WD0~word line selection signal WDn. As a result, the memory cell transistors in the row direction of the memory cell array at memory cell area 6B are all selected, and data read out is enabled.

Y decoder 2 decodes one portion of the plurality of bits of address signal AD, and outputs the Y decoder signal YD to Y selector 7. Y selector 7 selects one main bit line from among main bit line D1~main bit line Dl that are connected to each memory cell transistor of memory cell 6, based on the input Y decoder signal YD.

As a result, the main bit line is connected to sense amplifier circuit 9, and read out of the memory cell transistor corresponding to address signal AD is enabled. As a result, Y selector 7 inputs the data stored in the selected memory cell transistor via the main bit line, and outputs the data as data signal DG to sense amplifier circuit 9.

So that current does not flow to the virtual main grounding line that has a grounding potential GND via memory cell transistors other than the memory cell transistor that was selected based on address data AD, Y selector 7 controls whether a specific bias voltage Vp (having the same potential as the main bit line connected to sense amplifier circuit 9, for example) is provided, grounded, or placed in the OPEN state, for each of the other main bit lines that are not connected to sense amplifier circuit 9, based on Y decoder signal YD. The specific potential Vp at this time is designated as the precharge signal PC from precharge circuit 8, and is output to Y selector 7.

Precharge circuit 8 is designed so that current does not flow to memory cell transistors other than the selected memory cell transistor, by means of impressing a bias voltage Vp on other main bit lines that are connected to non-selected memory cell transistors that are near the memory cell transistor that was selected by address signal AD inside memory cell area 16B.

Data is stored in the aforementioned memory cell transistor that forms memory cell array 6B as a result of changing the threshold voltage at which the ON/OFF state of the transistor is controlled for each data to be recorded. In other words, the memory cell transistor stores data by changing the threshold voltage of the transistor, so that when a word selection line connected to a gate is activated and enters an ON state, the current proportionate to the threshold value flows, and the stored data is determined based on the detection of this current value. In the case where the data to be recorded is binary, for example, the threshold of the memory cell transistor is controlled to two cases at the voltage at which the word selection line is supplied to the gate, i.e., the transistor enters the ON state and current flows, or the transistor enters the OFF state and current does not flow.

Sense amplifier circuit 9 compares the current value of this input data signal DG and the current value of reference signal RG input from reference circuit 10. If the current value of data signal DG is greater than the current value of reference signal RG at this time for example, then the threshold value is low, current flows with the memory cell transistor in the ON state, and the data stored in the memory cell transistor is [L]. Conversely, if the current value of data signal DG is smaller than the current value of reference signal RG, then the threshold value is high, the memory cell transistor is in the OFF state, current does not flow, and the data stored in the memory cell transistor is [H].

Sense amplifier circuit 9 outputs the results of the above comparison of current values as data signal D0. In other words, data signal D0 is output at [L] level when the data stored in the memory cell transistor is [L], and data signal D0 is output at [H] level when the data stored in the memory cell transistor is [H]. This output data D0 is output to an external circuit from an output buffer not shown in the figures via a latch circuit, also not shown in the figures.

Reference circuit 10 is formed of a constant voltage circuit (a voltage stabilizer) which outputs a voltage level that is intermediate between the voltage level of the bit signal when the data stored in the memory cell transistor in memory cell area 6B is [H] and the voltage level of the bit signal when the data stored in the memory cell transistor in memory cell area 6B is [L] level.

For example, reference circuit 10 may have a design employing a reference transistor in which the threshold value is controlled so that the voltage level of reference signal RG determined by the current that flows following selection by the word selection line is a voltage level that is intermediate between the voltage level of the main bit line in the case where the data stored in the memory cell transistor selected by the word selection line is [H] and the voltage level of the main bit line in the case where the data stored in the memory cell transistor selected by the word selection line is [L].

Bank decoder 3 decodes a portion of the address signal AD, and outputs bank selection signal BS0~bank selection signal BS5 as the decoded result to bank selection signal lines corresponding to bank selector 6A and bank selector 6C respectively. In other words, bank selection signal BS0~bank selection signal BS2 are output to the bank selection signal line of bank selector 6A. In addition, bank selection signal BS3~bank selection signal BS5 are output to the bank selection line of bank selector 6C. Bank selection signal BS0~bank selection signal BS5 are signals that are different from bank selection signal BS0~bank selection signal BS3 of the conventional example.

Virtual GND selector 5 selects one virtual main grounding line from among virtual main grounding line V1~virtual main grounding line Vk that are connected to the memory cell transistor of memory cell array 6B based on address signal AD from address buffer 1, and designates the selected line as grounding potential GND. The virtual main grounding lines that were not selected are either supplied with a specific bias voltage Vp (having the same potential as the main bit line connected to sense amplifier circuit 9, for example) or are placed in the OPEN state. This control is carried out so that current does not flow to the virtual main grounding line having grounding potential GND via memory cell transistors other than the memory cell transistor that was selected based on address data AD. "OPEN state" as used here means a state in which there is no connection to the voltage source or the current source.

Figure 2:
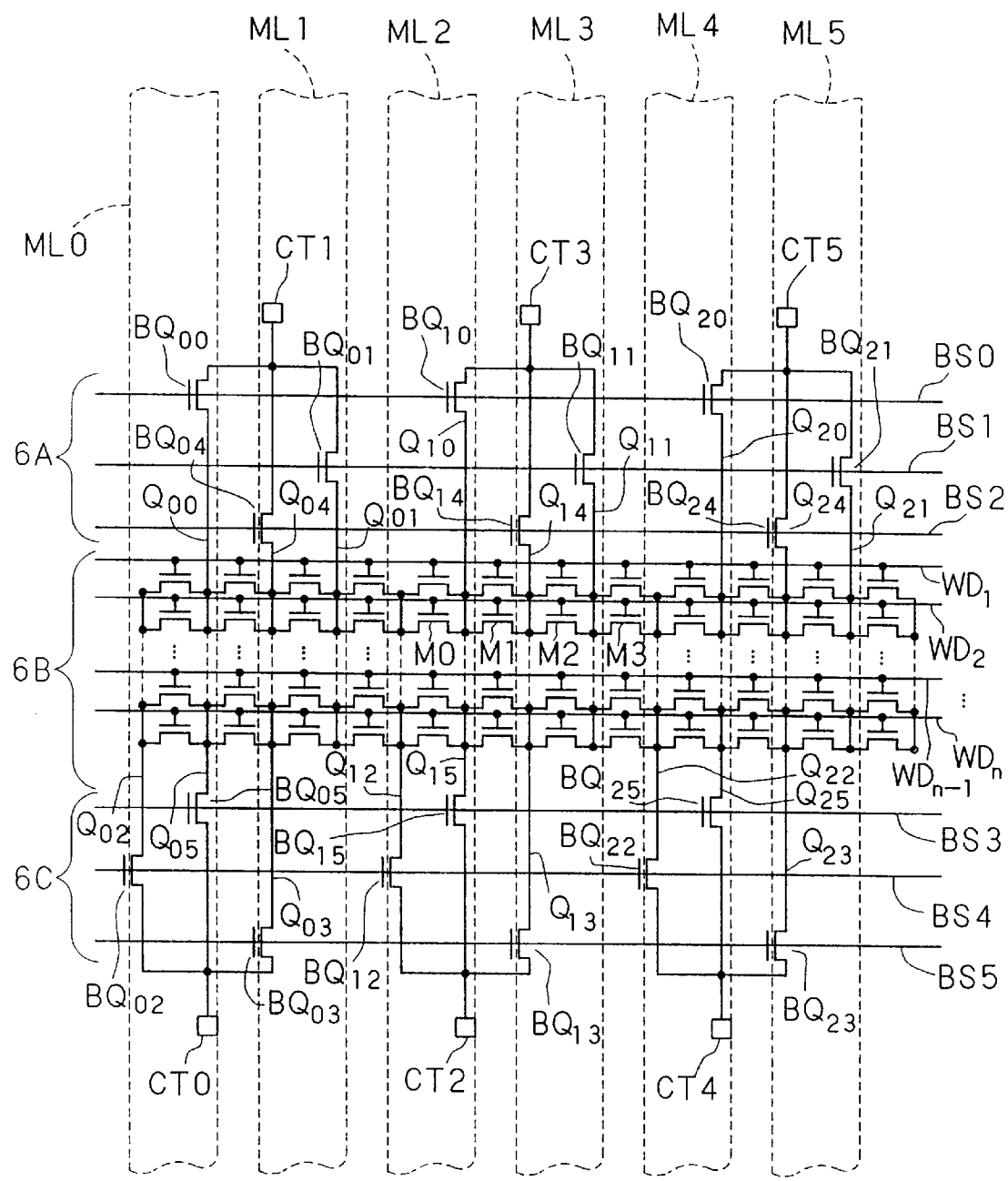
FIG. 2 is a conceptual diagram showing the structure of memory cell 6 in the semiconductor memory device of FIG. 1.

A detailed explanation of memory cell 6 will now be made employing FIG. 2. FIG. 2 is a conceptual diagram showing the structure of memory cell 6, excluding the area related to main bit line D1~main bit line D3 and virtual main grounding line V1~virtual main grounding line V3. In this figure, bank selector 6A is formed of MOS transistor BQ00, MOS transistor BQ01, MOS transistor BQ04, MOS transistor BQ10, MOS transistor BQ11, MOS transistor BQ14, MOS transistor BQ20, MOS transistor BQ21, and MOS transistor BQ24.

Similarly, bank selector 6C is formed of MOS transistor BQ02, MOS transistor BQ03, MOS transistor BQ05, MOS transistor BQ12, MOS transistor BQ13, MOS transistor BQ15, MOS transistor BQ22, MOS transistor BQ23, and MOS transistor BQ25.

The drains of MOS transistor BQ00, MOS transistor BQ01, and MOS transistor BQ04 are connected to metal wire ML1 (main bit line D1) via contact CT1. The gate of MOS transistor BQ00 is connected to the bank selection signal line of bank selection signal BS0, and the source is connected to the source and drain of the memory cell transistor of memory cell array 6B via sub-bit line Q00. The gate of MOS transistor BQ01 is connected to the bank selection signal line of bank selection signal BS1, and the source is connected to the source and drain of the memory cell transistor of memory cell array 6B via sub-bit line Q01. The gate of MOS transistor BQ04 is connected to the bank selection signal line of bank selection signal BS2, and the source is connected to the source and drain of the memory cell transistor of memory cell array 6B via sub-bit line Q04.

The drains of MOS transistor BQ10, MOS transistor BQ11, and MOS transistor BQ14 are connected to metal wire ML3 (main bit line D2) via contact CT3. The gate of MOS transistor BQ10 is connected to the bank selection signal line of bank selection signal BS0, and the source is connected to the source and drain of the memory cell transistor of memory cell array 6B via sub-bit line Q10. The gate of MOS transistor BQ11 is connected to the bank selection signal line of bank selection signal BS1, and the source is connected to the source and drain of the memory cell transistor of memory cell array 6B via sub-bit line Q11. The gate of MOS transistor BQ14 is connected to the bank selection signal line of bank selection signal BS2, and the source is connected to the source and drain of the memory cell transistor of memory cell array 6B via sub-bit line Q14.

The drains of MOS transistor BQ20, MOS transistor BQ21, and MOS transistor BQ24 are connected to metal wire ML5 (main bit line D3) via contact CT5. The gate of MOS transistor BQ20 is connected to the bank selection signal line of bank selection signal BS0, and the source is connected to the source and drain of the memory cell transistor of memory cell array 6B via sub-bit line Q20. The gate of MOS transistor BQ21 is connected to the bank selection signal line of bank selection signal BS1, and the source is connected to the source and drain of the memory cell transistor of memory cell array 6B via sub-bit line Q21. The gate of MOS transistor BQ24 is connected to the bank selection signal line of bank selection signal BS2, and the source is connected to the source and drain of the memory cell transistor of memory cell array 6B via sub-bit line Q24.

The sources of MOS transistor BQ02, MOS transistor BQ03, and MOS transistor BQ05 are connected to metal wire ML0 (virtual main grounding line V1) via contact CT0. The gate of MOS transistor BQ02 is connected to the bank selection signal line of bank selection signal BS4, and the drain is connected to the source and drain of the memory cell transistor of memory cell array 6B via virtual sub-grounding line Q02. The gate of MOS transistor BQ03 is connected to the bank selection signal line of bank selection signal BS5, and the source is connected to the source and drain of the memory cell transistor of memory cell array 6B via virtual sub-grounding line Q03. The gate of MOS transistor BQ05 is connected to the bank selection signal line of bank selection signal BS3, and the source is connected to the source and drain of the memory cell transistor of memory cell array 6B via virtual sub-grounding line Q05.

The sources of MOS transistor BQ12, MOS transistor BQ13, and MOS transistor BQ15 are connected to metal wire ML2 (virtual main grounding line V2) via contact CT2. The gate of MOS transistor BQ12 is connected to the bank selection signal line of bank selection signal BS4, and the drain is connected to the source and drain of the memory cell transistor of memory cell array 6B via virtual sub-grounding line Q12. The gate of MOS transistor BQ13 is connected to the bank selection signal line of bank selection signal BS5, and the source is connected to the source and drain of the memory cell transistor of memory cell array 6B via virtual sub-grounding line Q13. The gate of MOS transistor BQ15 is connected to the bank selection signal line of bank selection signal BS3, and the source is connected to the source and drain of the memory cell transistor of memory cell array 6B via virtual sub-grounding line Q15.

The sources of MOS transistor BQ22, MOS transistor BQ23, and MOS transistor BQ25 are connected to metal wire ML4 (virtual main grounding line V4) via contact CT4. The gate of MOS transistor BQ22 is connected to the bank selection signal line of bank selection signal BS4, and the drain is connected to the source and drain of the memory cell transistor of memory cell array 6B via virtual sub-grounding line Q22. The gate of MOS transistor BQ23 is connected to the bank selection signal line of bank selection signal BS5, and the source is connected to the source and drain of the memory cell transistor of memory cell array 6B via virtual sub-grounding line Q23. The gate of MOS transistor BQ25 is connected to the bank selection signal line of bank selection signal BS3, and the source is connected to the source and drain of the memory cell transistor of memory cell array 6B via virtual sub-grounding line Q25.

When reading out stored data from the memory cell transistor selected according to address data AD, control is exercised by GND selector 5 so that a main bit line that is adjacent to and at a specific interval from the selected main bit line always assumes an equivalent potential impression pattern as a result of Y selector 7, regardless of which memory cell transistor in memory cell array 6B is selected.

For example, when reading out stored data from any one of memory cell transistor M0, memory cell transistor M1, memory cell transistor M2 and memory cell transistor M3 that are connected to metal wire ML3 (main bit line D2), virtual GND selector 5 sets the same voltage impression state for adjacent metal wire ML2 (virtual main grounding line V2) and metal wire ML4 (virtual main grounding line V2), in the case of any of memory cell transistor M0, memory cell transistor M1, memory cell transistor M2 and memory cell transistor M3.

In other words, in the case where metal wire ML2 (virtual main grounding line V2) has grounding potential GND when metal wire ML3 (main bit line D2) is connected to sense amplifier circuit 9 by Y selector 7, virtual GND selector 5 sets metal wire ML4 to a specific bias voltage Vp. When metal wire ML2 (virtual main connecting line V2) is set to a specific bias voltage Vp, then metal wire ML4 has grounding potential GND.

Virtual GND selector 5 sets the voltage impression state of metal wires adjacent to the metal wire connected to sense amplifier circuit 9 to be the same for any memory cell transistor selected for data read out. For this reason, it is necessary to control the tendency for current to flow to the selected memory cell transistor. Thus, a MOS transistor for directional control of current is provided to bank selector 6A and bank selector 6C of the semiconductor memory device according to the first embodiment. This type of MOS transistor for controlling the current direction is absent in the conventional art.

The direction control MOS transistor of bank selector 6A comprises a MOS transistor BQ04 in which source is connected to the drain of MOS transistor BQ03 via sub-bit line Q04 and sub-bit line Q03; a MOS transistor BQ14 in which the source is connected to the drain of MOS transistor BQ13 via sub-bit line Q14 and sub-bit line Q13; and MOS transistor BQ24 in which the source is connected to the drain of MOS transistor BQ23 via sub-bit line Q24 and sub-bit line Q23.

The direction control MOS transistor of bank selector 6C comprises a MOS transistor BQ05 in which the drain is connected to the source of MOS transistor BQ00 via-sub bit line Q05 and sub-bit line Q00; a MOS transistor BQ15 in which the drain is connected to the source of MOS transistor BQ10 via sub-bit line Q15 and sub-bit line Q10; and MOS transistor BQ25 in which the drain is connected to the drain of MOS transistor BQ20 via sub-bit line Q25 and sub-bit line Q20.

According to the design of the above-described memory cell array 6, the voltage impression states of metal wires (virtual main grounding lines) adjacent to the metal wires (main bit lines) connected to sense amplifier circuit 9 are set in the same way for any memory cell transistor selected for readout. Therefore, also in the case of selecting memory cell transistor and reading out data from the cell, bank decoder 3 controls each MOS transistor in bank selector 6A and bank selector 6C so that the sub-bit line that is connected to the drain of the selected memory cell transistor is connected to the metal wire (main bit line), and the sub-bit line that is connected to the source of the selected memory cell transistor is connected to the metal wire (main bit line) that has grounding potential GND.

Figures 3, 4:
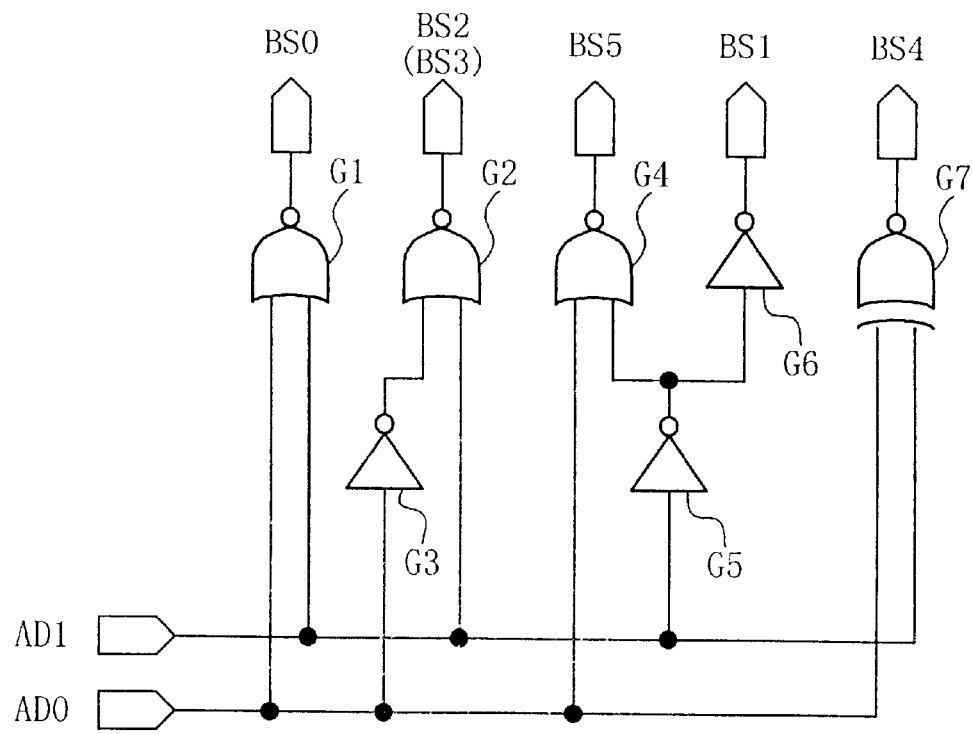
FIG. 3 is a circuit diagram showing the structure of bank decoder 3 in the semiconductor memory device of FIG. 1.
FIG. 4 is a table showing a truth table for the actions of bank decoder 3 shown in FIG. 3.

Next, the detailed structure of bank decoder 3 will be explained using FIG. 3. FIG. 3 is a circuit diagram showing the structure of the bank decoder. In this figure, input address signals AD0 and AD1 are a portion of the address signal AD in FIG. 1. Bank decoder 3 generates bank selection signal BS0~bank selection signal BS5 based on this address signal AD0 and address signal AD1.

NOR circuit G1 performs a negative logical OR operation for address signal AD0 and address signal AD1, and generates bank selection signal BS0 as the calculated result. NOR circuit G2 performs a negative logical OR operation for the data obtained when address signal AD0 is inverted by inverter G3 and for address signal AD1, and generates bank selection signal BS2 and selection signal BS3 as the result of this operation.

NOR circuit G4 performs a negative logical OR operation for the data obtained when address signal AD1 is inverted by inverter G5 and for address signal AD0, and generates bank selection signal BS5 as the result of this operation. Inverter G6 again inverts the data obtained when inverter G5 inverted address signal AD1, and generates bank selection signal BS1. Exclusive circuit G7 performs a negative exclusive OR operation for address signal AD0 and address signal AD1, and generates bank selection signal BS4 as the result of this operation.

In addition, FIG. 4 shows a table showing the truth table for bank selection signal BS0~bank selection signal BS5 output by bank decoder 3 in FIG. 3, based on the input address signal AD0 data and the address signal AD1 data.

For example, when address signal AD0 is input at [L] level and address signal AD1 is input at [L] level, bank selection signal BS0 is output at [H] level, bank selection signal BS1 is output at [L] level, bank selection signal BS2 is output at [L] level, bank selection signal BS3 is output at [L] level, bank selection signal BS4 is output at [H] level, and bank selection signal BS5 is output at [L] level.

Next, FIGS. 1 and 2 will be employed to explain the potential pattern that is impressed on main bit line D1~main bit line D3 and virtual main grounding line V1~virtual main grounding line V3, for the purpose of confirming the impression state of the voltage at the adjacent metal wire ML2 and metal wire ML4 during read out of memory cell transistor M0, memory cell transistor M1, memory cell transistor M2 and memory cell transistor M3, respectively, in the above-described semiconductor memory device according to the first embodiment.

When reading out data stored in any of the memory cell transistors at memory cell array 6B, one of the following four impression potential patterns results.

The memory cell transistor and MOS transistor will be explained below assuming that all are n channel MOS transistors.

a. First Impression Pattern (Read Out of Memory Cell Transistor M0)

In order to sense the current flowing to memory cell transistor M0, the following impression patterns are employed so that current does not flow to other memory cell transistors from the metal wire ML3 (main bit line D2) that is connected to sense amplifier circuit 9.

Figure 5:
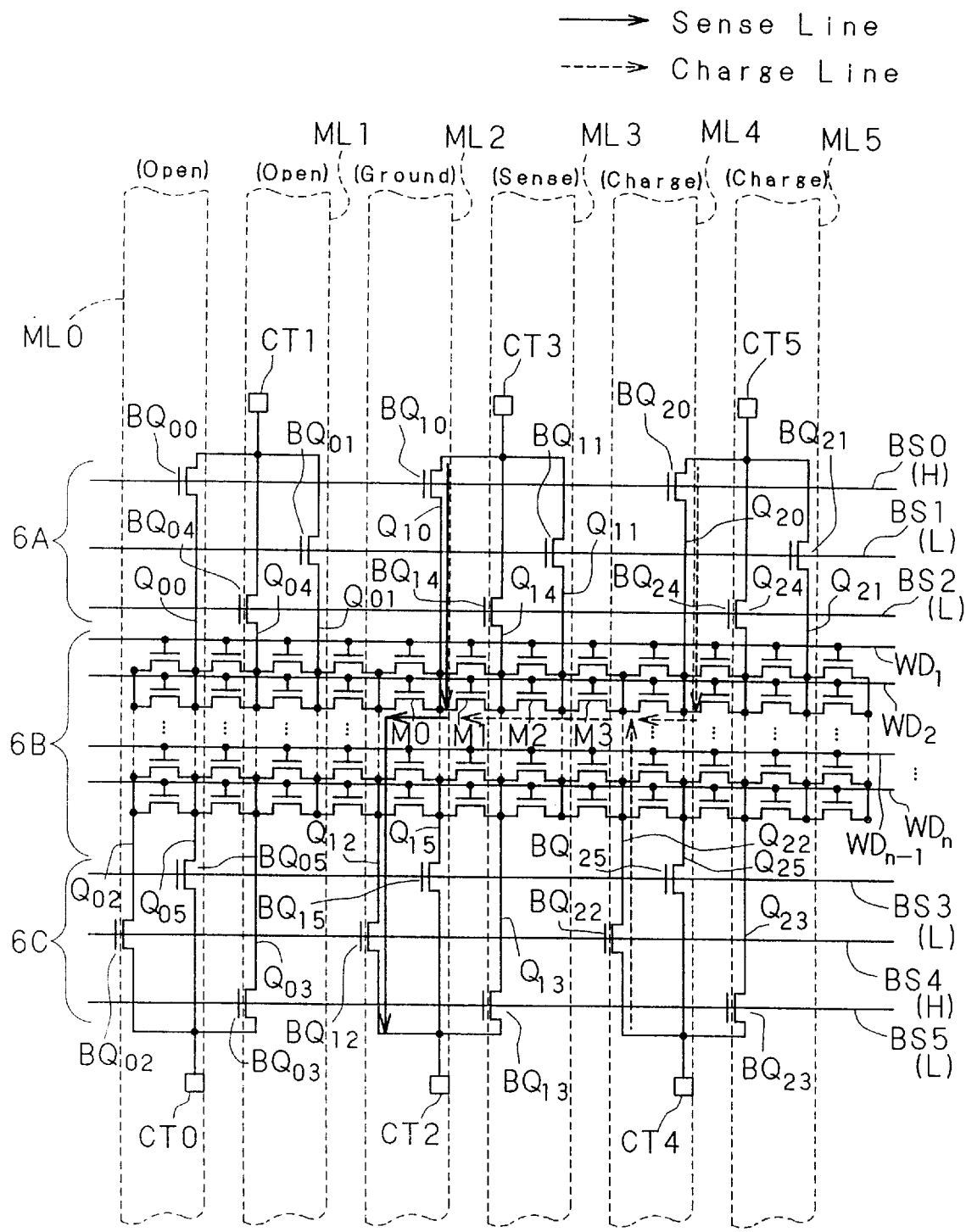
FIG. 5 is a diagram showing the voltage impression pattern for metal wire ML0~metal wire ML5 when the data stored in the memory cell transistor M0 in memory cell 6 shown in FIG. 2 is read out.

For example, as shown in FIG. 5, based on Y decoder signal YD input from Y decoder 2 in response to address signal AD data for selecting cell transistor M0, Y selector 7 places metal wire ML1 (main bit line D1) in the OPEN state, thereby connecting metal wire ML3 (main bit line D2) and sense amplifier circuit 9. In addition, similarly, the Y selector impresses a specific bias voltage Vp onto metal wire ML5 (main bit line D3) based on Y decoder signal YD.

Based on address signal AD data for selecting cell transistor M0, virtual GND selector 5 places metal wire ML0 (virtual main grounding line V1) in the OPEN state, sets metal wire ML2 (virtual main grounding line V2) as grounding potential GND, and sets metal wire ML4 (virtual main grounding line V3) to a specific bias voltage Vp. These voltage impression states are shown within parentheses ( ) at the upper portion of metal wire ML0~metal wire ML5 in the figure.

Next, in response to address AD data for selecting cell transistor M0, [L] level address signal AD0 and [L] level address signal AD1 are input to bank decoder 3, and bank decoder 3 sets bank selection signal BS0 and bank selection signal BS4 to [H] level. As a result, MOS transistor BQ00, MOS transistor BQ10, MOS transistor BT20, MOS transistor BQ02, MOS transistor BQ12, and MOS transistor BQ22 are placed in the ON state.

As a result, the drain of memory cell transistor M0 is connected to metal wire ML3 (main bit line D2) via MOS transistor BQ10. The source of memory cell transistor M0 is connected to metal wire ML2 (virtual main grounding line V2 which becomes grounding potential GND) via MOS transistor BQ12.

Next, in response to address AD data for selecting cell transistor M0, X decoder 4 sets word line WD2 to [H] level. As a result, all memory cell transistors in which the gate is connected to word line WD2 enter the ON state, including memory cell transistor M0, memory cell transistor M1, memory cell transistor M2, and memory cell transistor M3.

However, the source and drain of the memory cell transistor which is connected to the source of memory cell transistor M0, i.e., the memory cell transistor positioned to the left of virtual sub-grounding line Q12, to which metal wire ML2 (virtual main grounding line V2) having grounding potential GND is connected, is placed in the OPEN state. For this reason, current from the source of memory cell transistor M0 flows only to metal wire ML2 (virtual main grounding line V2) via virtual sub-grounding line Q12.

In addition, the source and drain of the memory cell transistor which is connected to the drain of memory cell transistor M0, i.e., the memory cell transistor positioned to the right of sub-bit line Q10, to which metal wire ML3 (main bit line D20), connected to sense amplifier circuit 9, is connected, assumes a specific potential Vp. For this reason, current from the metal wire ML2 connected to sense amplifier circuit 9 flows only into the drain of memory cell transistor M0 via sub-bit Q10.

As explained above, Y decoder 2, bank decoder 3, Y selector 7 and virtual GND selector 5 carry out processing in response to address AD data for selecting memory cell transistor M0 so that current from sense amplifier circuit 9 flows only to memory cell transistor M0. As a result, the data stored in memory cell transistor M0 is accurately read out.

b. Second Impression Pattern (Read Out of Memory Cell Transistor M1)

In order to sense the current flowing to memory cell transistor M1, the following impression pattern is established so that current does not flow to other memory cell transistors from metal wire ML3 (main bit line D2) that is connected to sense amplifier circuit 9.

Figure 6:
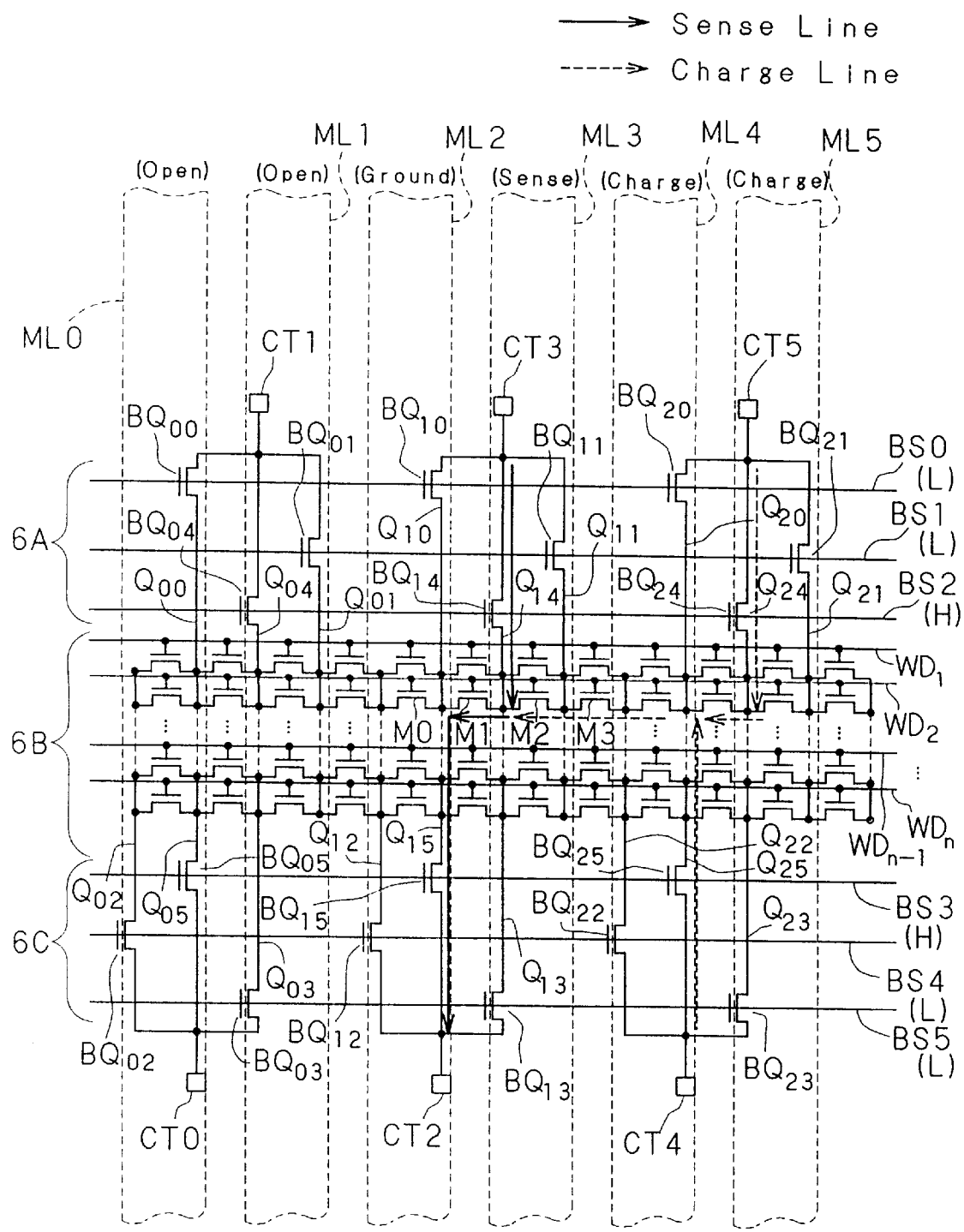
FIG. 6 is a diagram showing the voltage impression pattern for metal wire ML0~metal wire ML5 when the data stored in the memory cell transistor M1 in memory cell 6 shown in FIG. 2 is read out.

For example, as shown in FIG. 6, based on Y decoder signal YD input from Y decoder 2 in accordance with data for address AD for selecting cell transistor M1, Y selector 7 places metal wire ML1 (main bit line D1) in the OPEN state and connects metal wire ML3 (main bit line D2) and sense amplifier circuit 9. In addition, similarly, the Y selector impresses a specific bias voltage Vp onto metal wire ML5 (main bit line D2) based on Y decoder signal YD.

Then, in accordance with the data for address AD for selecting cell transistor M1, virtual GND sector 5 opens metal wire ML0 (virtual main grounding line V1), sets metal wire ML2 (virtual main grounding line V2) to grounding potential GND, and sets metal wire ML4 (virtual main grounding line V3) to a specific bias voltage Vp.

In accordance with the data for address AD for selecting cell transistor M1, i.e., [H] level address signal AD0 and [L]

level address signal AD1 are input to bank decoder 3, and bank decoder 3 sets bank selection signal BS2 and bank selection signal BS3 to [H] level. As a result, MOS transistor BQ04, MOS transistor BQ14, MOS transistor BQ24, MOS transistor BQ05, MOS transistor BQ15 and MOS transistor BQ25 are placed in the OPEN state.

As a result, the drain for memory cell transistor M1 is connected to metal wire ML3 (main bit line D2) via MOS transistor BQ14. In addition, the source of memory cell transistor M1 is connected to metal wire ML2 (virtual main grounding line V2 which assumes grounding potential GND) via MOS transistor BQ15.

Next, X decoder 4 sets word line WD2 to [H] level in accordance with the data for address AD for selecting cell transistor M1. As a result, all memory cell transistors for which the gate is connected to word line WD2 are placed in the ON state, these including memory cell transistor M0, memory cell transistor M1, memory cell transistor M2 and memory cell transistor M3.

However, the source and drain for the memory cell transistor positioned to the right with respect to virtual sub-grounding line Q15 which is connected to the memory cell transistor M1 source, i.e., to which metal wire ML2 (virtual main grounding line V2) which assumes grounding potential GND is connected, are placed in OPEN state. For this reason, current flows only into metal wire ML2 via virtual sub-grounding line Q15.

The source and drain for the memory cell transistor positioned to the right with respect to sub-bit line Q14, which is connected to the memory cell transistor M1 source, i.e., to which metal wire ML3 (main bit line D2), connected to sense amplifier circuit 9, is connected, assumes a specific potential Vp. For this reason, the current that flows from metal wire ML3 (main bit line D2) that is connected to sense amplifier circuit 9 flows only into the drain of memory cell transistor M1 via sub-bit Q14.

As described above, in accordance with the data for address AD for selecting memory cell transistor M1, Y decoder 2, bank decoder 3, Y selector 7 and virtual GND selector 5 operate so that the current from sense amplifier circuit 9 flows into memory cell transistor M1 only. As a result, the data stored in memory cell transistor M1 is accurately read out.

c. Third Impression Pattern (Read Out of Memory Cell Transistor M2)

In order to sense the current flowing to memory cell transistor M2, the following impression pattern is established so that current does not flow to other memory cell transistors from metal wire ML3 (main bit line D2) that is connected to sense amplifier circuit 9.

Figure 7:
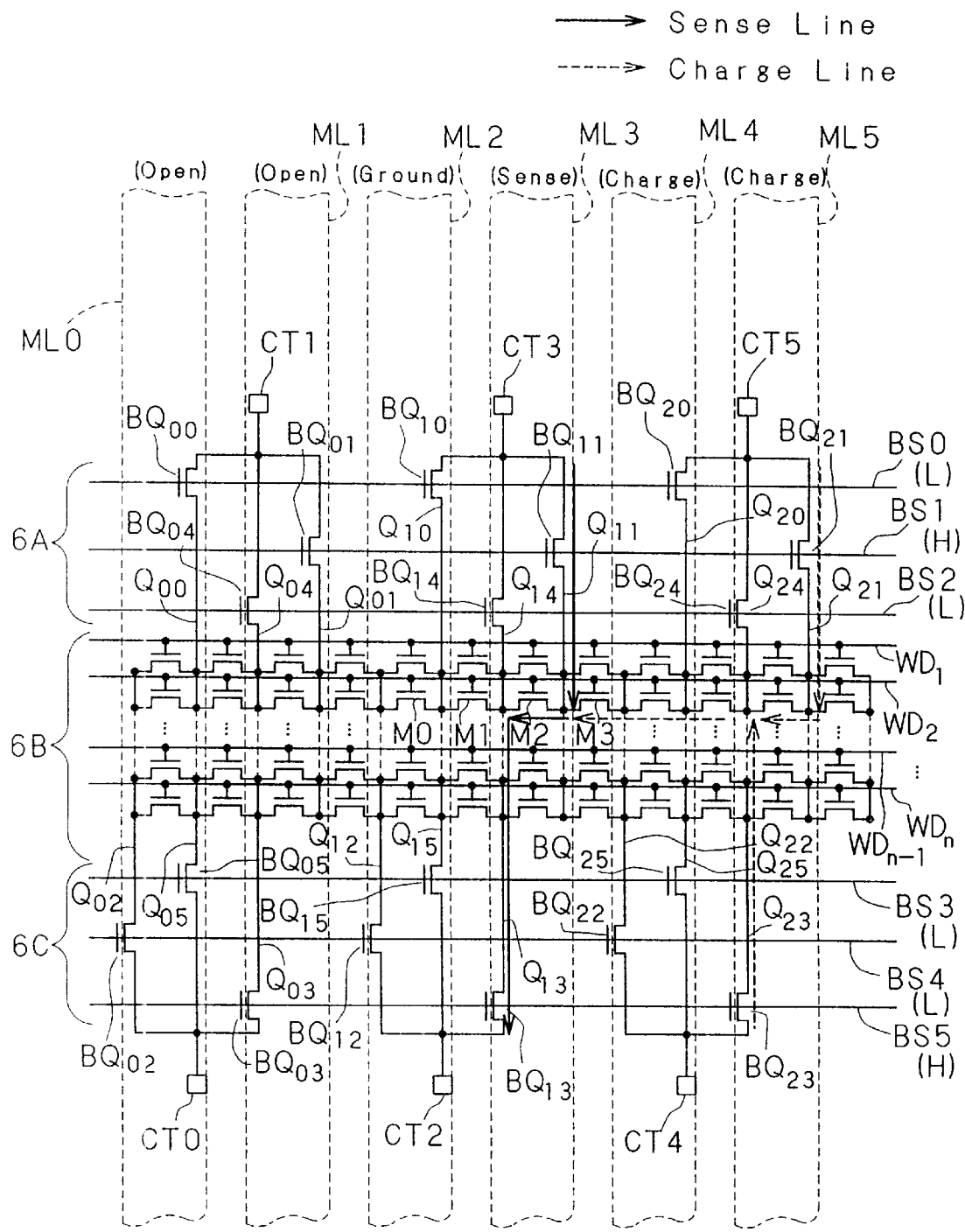
FIG. 7 is a diagram showing the voltage impression pattern for metal wire ML0~metal wire ML5 when the data stored in the memory cell transistor M2 in memory cell 6 shown in FIG. 2 is read out.

As shown in FIG. 7 for example, Y selector 7 places metal wire ML1 (main bit line D1) in the OPEN state based on Y decoder signal YD input from Y decoder 2 in accordance with the data in address AD for selecting cell transistor M2, and connects metal wire ML3 (main bit line D2) and sense amplifier circuit 9. Similarly, the Y selector impresses a specific bias voltage Vp on metal wire ML5 (main bit line D2) based on Y decoder signal YD.

In accordance with the data in address AD for selecting cell transistor M1, virtual GND selector 5 places metal wire ML0 (virtual main grounding line V1) in the OPEN state, sets metal wire ML2 (virtual main grounding line V2) as the grounding potential GND, and sets metal wire ML4 (virtual main grounding line V3) to a specific bias voltage Vp.

Then, in accordance with the data for address AD for selecting cell transistor M2, i.e., [L] level address signal AD0 and [H] level address signal AD1 are input to bank decoder 3, bank decoder 3 sets the bank selection signal BS1 and bank selection signal BS5 to [H] level. As a result, MOS transistor BQ01, MOS transistor BQ11, MOS transistor BQ21, MOS transistor BQ03, MOS transistor BQ13 and MOS transistor BQ23 are placed in the ON state.

As a result, the drain for memory cell transistor M2 is connected to metal wire ML3 (main bit line D2) via MOS transistor BQ11. In addition, the source of memory cell transistor M2 is connected to metal wire ML2 (virtual main grounding line V2 which becomes grounding potential GND) via MOS transistor BQ13.

Next, X decoder 4 sets word line WD2 to [H] level in accordance with the data for address AD for selecting cell transistor M2. As a result, all memory cell transistors for which the gate is connected to word line WD2 are placed in the ON state, these including memory cell transistor M0, memory cell transistor M1, memory cell transistor M2 and memory cell transistor M3.

However, the source and drain for the memory cell transistor positioned to the left with respect to virtual sub-grounding line Q13 which is connected to the memory cell transistor M2 source, i.e., to which metal wire ML2 (virtual main grounding line V2) which assumes the grounding potential GND is connected, are placed in the OPEN state. For this reason, the current from the memory cell transistor M1 source flows only into metal wire ML2 (virtual main grounding line V2) via virtual sub-grounding line Q13.

The source and drain for the memory cell transistor positioned to the right with respect to sub-bit line Q11 which is connected to the memory cell transistor M2 drain, i.e., to which metal wire ML3 (main bit line D2), connected to sense amplifier circuit 9, is connected, becomes a specific potential Vp. For this reason, the current that flows from metal wire ML3 (main bit line D2) that is connected to sense amplifier circuit 9 flows only into the drain of memory cell transistor M2 only via sub-bit line Q13.

As described above, in accordance with the data for address AD for selecting memory cell transistor M2, Y decoder 2, bank decoder 3, Y selector 7 and virtual GND selector 5 operate so that the current from sense amplifier circuit 9 flows into memory cell transistor M2 only. As a result, the data stored in memory cell transistor M2 is accurately read out.

d. Fourth Impression Pattern (Read Out of Memory Cell Transistor M3)

In order to sense the current flowing to memory cell transistor M3, the following impression pattern is established so that current does not flow to other memory cell transistors from metal wire ML3 (main bit line D2) that is connected to sense amplifier circuit 9.

Figure 8:
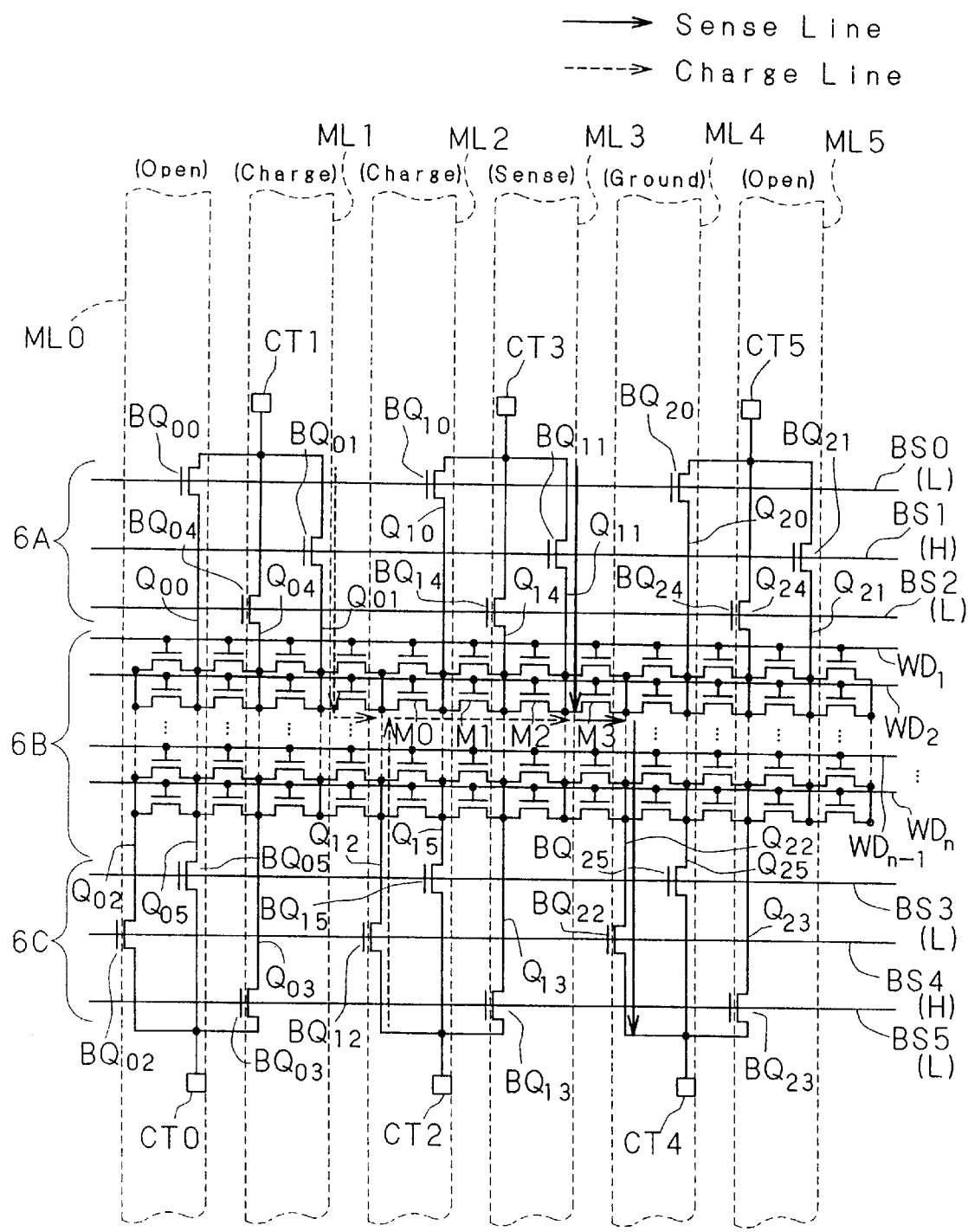
FIG. 8 is a diagram showing the voltage impression pattern for metal wire ML0~metal wire ML5 when the data stored in the memory cell transistor M3 in memory cell 6 shown in FIG. 2 is read out.

For example, as shown in FIG. 8, based on the Y decoder signal YD input from Y decoder 2 in accordance with data for address AD for selecting cell transistor M3, Y selector 7 places metal wire ML5 (main bit line D3) in the OPEN state and connects metal wire ML3 (main bit line D2) and sense amplifier circuit 9. In addition, similarly, the Y sector impresses a specific bias voltage Vp onto metal wire ML1 (main bit line D1) based on Y decoder signal YD.

Then, in accordance with the data for address AD for selecting memory cell transistor M3, virtual GND sector 5 places metal wire ML0 (virtual main grounding line V1) in the OPEN state, sets metal wire ML4 (virtual main grounding line V3) to the grounding potential GND, and sets metal wire ML2 (virtual main grounding line V2) to a specific bias voltage Vp.

In accordance with the data for address AD for selecting cell transistor M3, i.e., an [H] level address signal AD0 and an [H] level address signal AD1 are input to bank decoder 3, bank decoder 3 sets bank selection signal BS1 and bank selection signal BS4 to [H] level. As a result, MOS transistor BQ01, MOS transistor BQ11, MOS transistor BQ21, MOS transistor BQ02, MOS transistor BQ12 and MOS transistor BQ22 are placed in the ON state.

As a result, the drain for memory cell transistor M3 is connected to metal wire ML3 (main bit line D2) via MOS transistor BQ11. In addition, the source of memory cell transistor M3 is connected to metal wire ML4 (virtual main grounding line V3 which assumes grounding potential GND) via MOS transistor BQ22.

Next, X decoder 4 sets word line WD2 to [H] level in accordance with the data for address AD for selecting cell transistor M3. As a result, all memory cell transistors for which the gate is connected to word line WD2 are placed in the ON state, these including memory cell transistor M0, memory cell transistor M1, memory cell transistor M2 and memory cell transistor M3.

However, the source and drain for the memory cell transistor positioned to the right with respect to virtual sub-grounding line Q22 which is connected to the memory cell transistor M3 source, i.e., to which metal wire ML4 (virtual main grounding line V3) which assumes grounding potential GND is connected, is placed in the OPEN state. For this reason, current from the memory cell transistor M3 source flows only into metal wire ML4 (virtual main grounding line V3) via virtual sub grounding line Q22.

The source and drain for the memory cell transistor positioned to the left with respect to sub-bit line Q11 which is connected to memory cell transistor M3 drain, i.e., to which metal wire ML3 (main bit line D2), connected to sense amplifier circuit 9, is connected, become a specific potential Vp. For this reason, the current that flows from metal wire ML3 (main bit line D2) that is connected to sense amplifier circuit 9 flows only into the drain of memory cell transistor M3 via sub-bit line Q11.

The source and the drain for the memory cell transistor that is positioned to the left with respect to sub-bit line BQ01 to which metal wire ML1 (main bit line D1) is connected is placed in the OPEN state. Accordingly, current does not flow from metal wire ML1 (main bit line D1).

As described above, in accordance with the data for address AD for selecting memory cell transistor M3, Y decoder 12, bank decoder 13, Y selector 17 and virtual GND selector 15 operate so that the current from sense amplifier circuit 9 flows into memory cell transistor M3 only. As a result, the data stored in memory cell transistor M3 is accurately read out.

As described above, in the impression pattern in the semiconductor memory device according to the first embodiment, the impression state for the voltage of metal wire ML2 (virtual main grounding line V2) and metal wire ML4 (virtual main grounding V3), which are adjacent to the metal wire ML3 (main bit line D2) that is connected to and sensed by sense amplifier circuit 9, is always constant. In other words, the impression state of the voltage of metal wire ML2 (virtual main grounding line V2) and metal wire ML4 (virtual main grounding line V3) that are adjacent to metal wire ML3 (main bit line D2) is as follows. Namely, metal wire ML4 (virtual main grounding line V3) assumes a specific voltage Vp when metal wire ML2 (virtual main grounding line V2) is grounding voltage GND, and metal wire ML4 (virtual main grounding line V3) assumes grounding voltage GND when metal wire ML2 (virtual main grounding line V2) becomes a specific voltage Vp.

For this reason, when data stored in a memory cell transistor in the semiconductor memory device according to the first embodiment of the present invention is read out, crosstalk noise is superimposed on the main bit line that is connected to sense amplifier circuit 9 for any memory cell transistor that is selected at memory cell array 16B.

Because crosstalk noise is always superimposed as described above, it is possible to establish the setting for the voltage level of reference signal RG from reference circuit 10 that is supplied to sense amplifier circuit 9 to be intermediate between the [H] level data and [L] level data in the memory cell transistor. Thus, it is not necessary in the semiconductor memory device according to a first embodiment of the present invention to set the reference voltage level corresponding to a plurality of main bit line potentials according to whether or not crosstalk noise is present as was the case in conventional examples. Therefore, with regard to the output of sense amplifier circuit 9, time is not required for the data actually stored in the memory cell transistor to stabilize, thus access time can be made faster.

Reference transistors are provided to each word selection line WD1~word selection line WDn in reference circuit 10 having the same structure as that of the memory cell transistor inside memory cell array 6B (see FIG. 2). In these reference transistors, the threshold is adjusted so that the output of the bias circuit 101 when ON has a potential level that is in the middle of the memory cell transistors in memory cell array 16B in which [H] and [L] data are stored.

The source of this reference transistor is grounded, the drain is connected to sense amplifier circuit 9, and reference signal RD is output to sense amplifier circuit 9. In order to provide the source and drain of the reference transistor with the same characteristics as a memory cell transistor in memory cell array 6B, it is acceptable to insert a MOS transistor comprising Y selector 7, bank selector 6A, bank selector 6C, and virtual GND selector 5.

Next, test results in a SPICE simulation will now be employed to explain the state in which access time is stable when reading out data stored in any memory cell transistor of memory cell array 6B for an impression pattern in which metal wire ML3 (main bit line D2) is constantly affected by crosstalk noise from adjacent metal wire ML2 and metal wire ML4 as described above.

Figure 19:
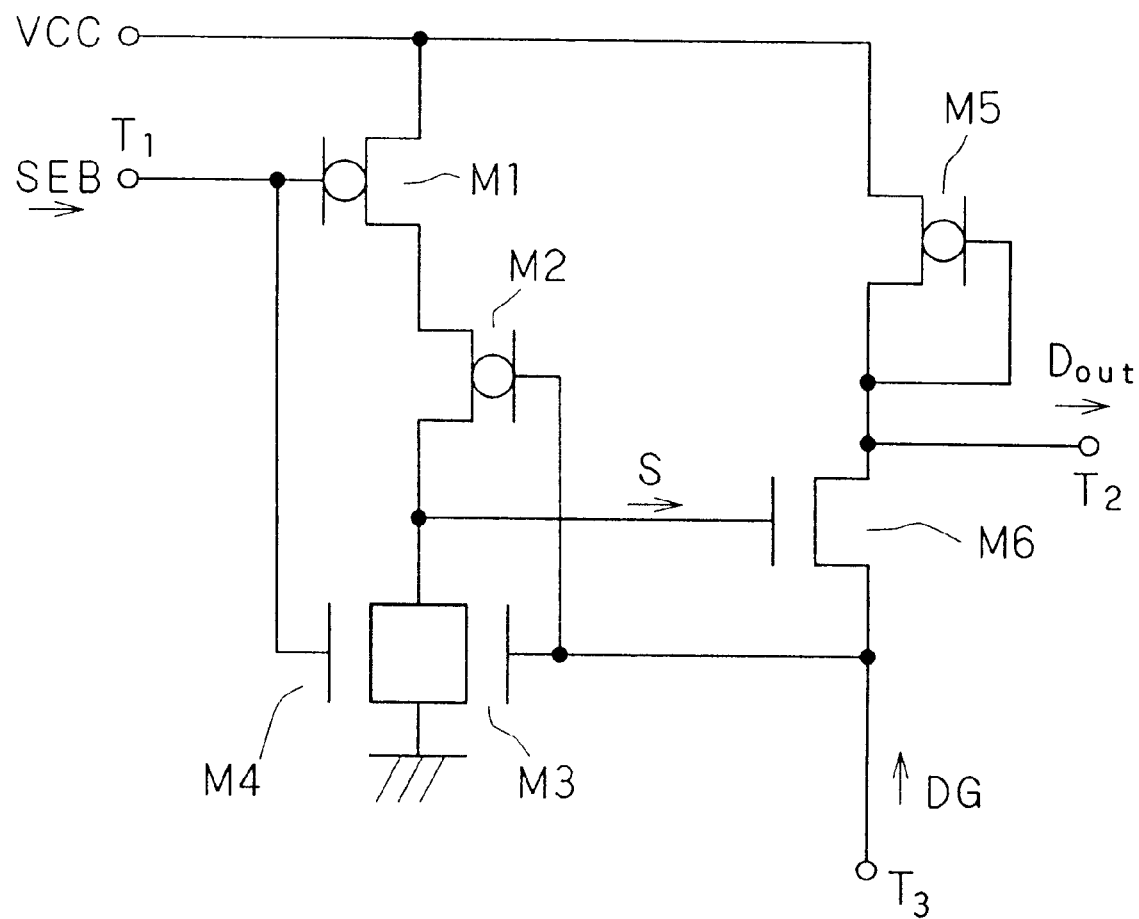
FIG. 19 is a circuit diagram showing the structure of the bias circuit 100 (bias circuit 101) in sense amplifier circuit 9 shown in FIGS. 1, 10 and 13.
Figure 20:
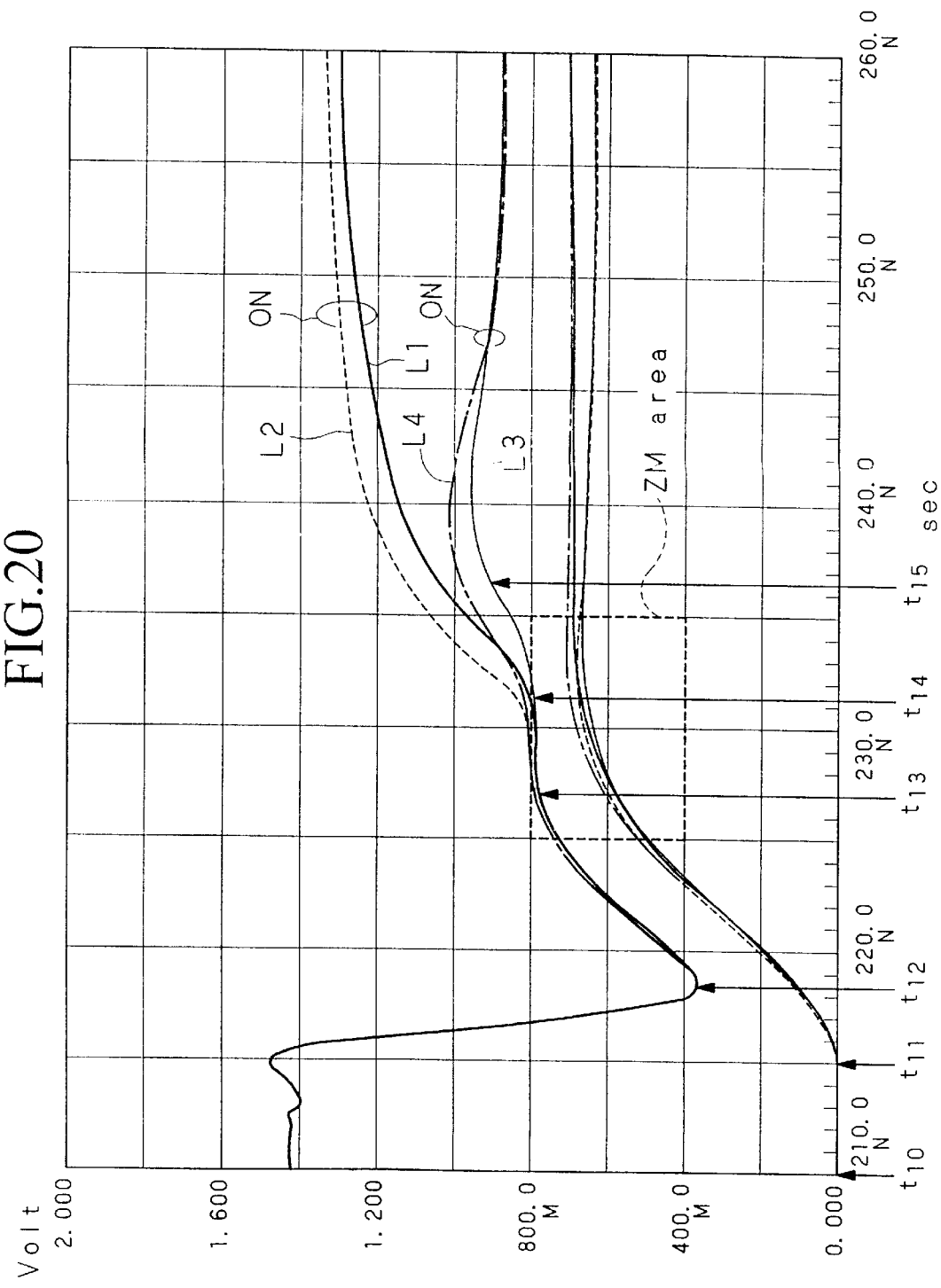
FIG. 20 is a diagram showing the results of a simulation for metal wire ML3 (main bit line D2) when the data recorded in memory cell transistor M0~memory cell transistor M3 in memory cell 16 shown in FIG. 14 is read out.
Figure 21:
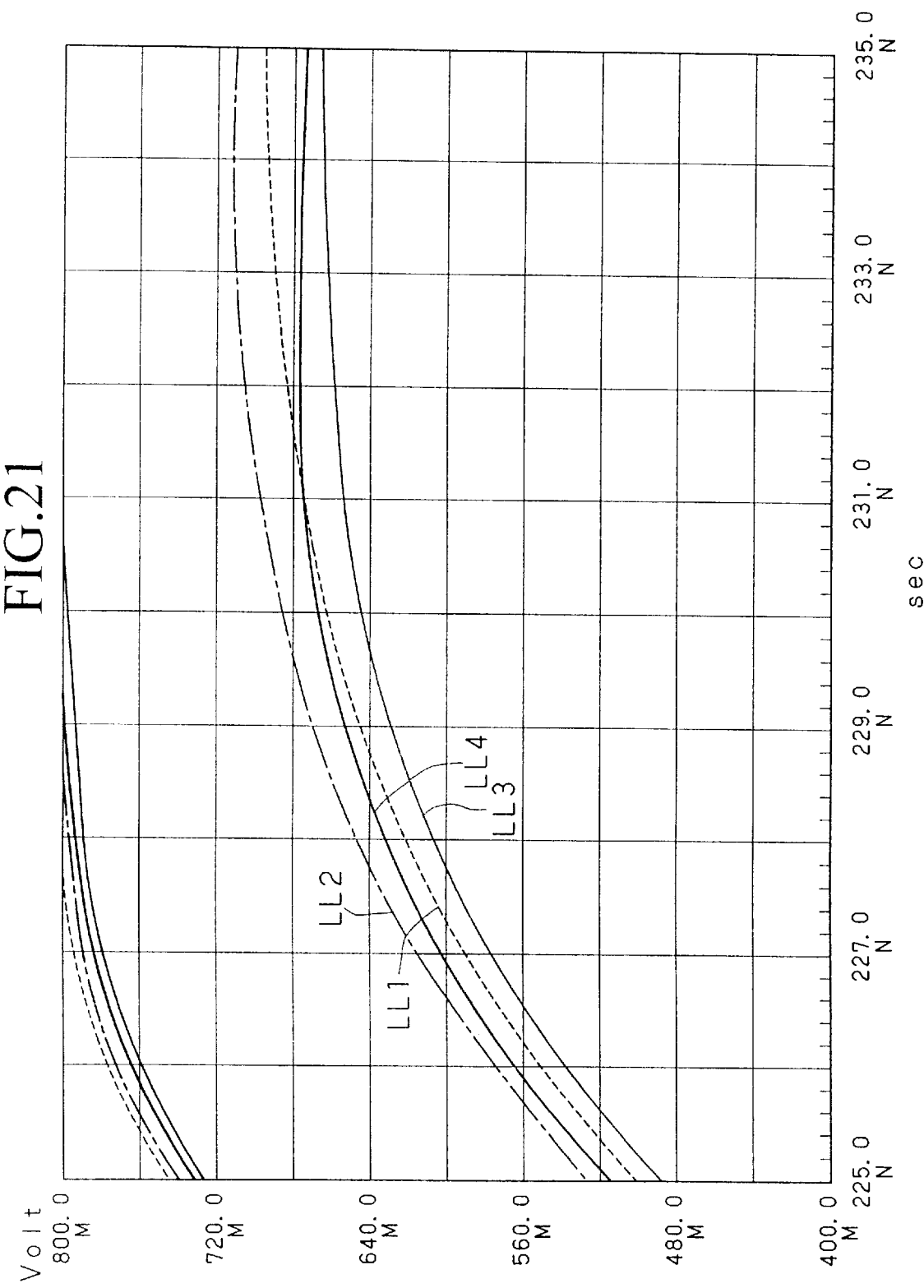
FIG. 21 is an enlarged diagram of area ZM in FIG. 20.

The voltage amplifying circuit employing this simulation to which metal wire ML3 (main bit line D2) is connected via Y selector 7 is equivalent to bias circuit 100 in FIG. 19 which was explained in the conventional example. Accordingly, a detailed explanation thereof will be omitted here.

When control signal SEB input from terminal T1 is at [H] level, MOS transistor M1 is in the OFF state and MOS transistor M4 is in the ON state, so that signal S becomes [L] level. As a result, MOS transistor M6 enters the OFF state, and the main bit line connected via Y selector 7 assumes an OPEN state with sense amplifier circuit 9. Accordingly, the output signal Dout that is output from terminal T2 becomes [H] level (voltage source Vcc).

Conversely, when control signal SEB input from terminal T1 is at [L] level, MOS transistor M1 enters the ON state and MOS transistor M4 enters the OFF state, so that signal S becomes [H] level. As a result, MOS transistor M6 enters the ON state, and the main bit line connected via Y selector 7 enters a state of connection with sense amplifier circuit 9. Accordingly, regarding the output signal Dout that is output from transistor terminal T2, the output signal Vout for the voltage corresponding to the threshold value of the memory cell transistor connected to the main bit line that is connected via Y selector 7 is output to a differential amplifying circuit in sense amplifier circuit 9.

At the same time, reference transistors in which there is a connection between the gate and the word selection line in the same row as the memory cell transistor selected corresponding to address signal AD enter the ON state in reference circuit 10. Reference signal DG is input to another bias circuit 101 having the same structure as bias circuit 100 inside sense amplifier circuit 9. The differential amplifying circuit provided inside sense amplifier circuit 9 compares the voltage Vd of output signal Dout output by this bias circuit 100 and the amplified voltage level of reference signal DG from reference circuit 10 output by the other bias circuit 101.

An [H]/[L] detection is performed on the results obtained from this comparison for the data stored in the memory cell transistor. For example, when voltage Vd is larger than the voltage level of the output from the other bias circuit 101, the data stored in the memory cell transistor is [H]. Conversely, when voltage Vd is smaller than the voltage level of the output from the other bias circuit 101, the data stored in the memory cell transistor is [L].

Accordingly, if the relative relationship over time between this voltage Vd and the voltage level of reference signal DG is simulated, then it is possible to judge to what extent crosstalk noise from adjacent metal wire ML2 and metal wire ML4 affects the access time in metal wire ML3 (main bit line D2).

Figure 9:
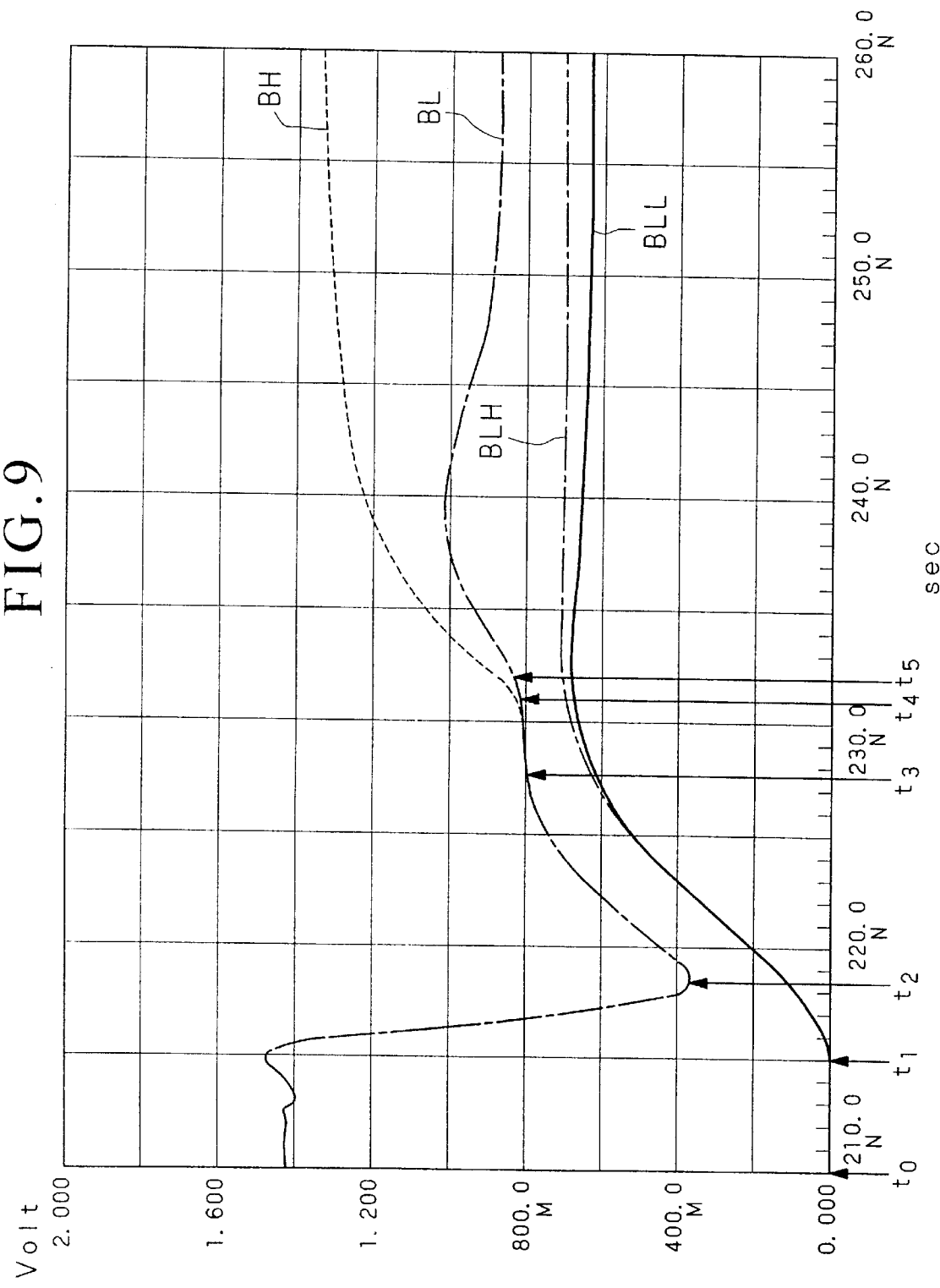
FIG. 9 is a diagram showing the results of a simulation for metal wire ML3 (main bit line D2) when the data stored in memory cell transistor M0~memory cell transistor M3 in memory cell 6 shown in FIG. 2 is read out.

Next, a diagram of the results of the simulation will be used to explain the action for reading out the data stored in a semiconductor memory device memory cell transistor. The explanation will be carried out referring to FIGS. 1, 2 and 9 in sequence. FIG. 9 is a diagram showing the results obtained when the action for reading out the data stored in the memory cell transistor is simulated using SPICE. In this figure, the voltage level is shown on the vertical axis, while time is shown on the horizontal axis (where 1 dot=1 ns).

In this figure, line BH shows the voltage level of output signal Dout from bias circuit 100 in the data read out from memory cell transistors in which [H] data is stored, in the case of all patterns of voltage impression on metal wire ML0~metal wire ML5 shown in FIGS. 1, 2, and 5~9. In the same manner as line BH, line BL shows the voltage level of output signal Dout from bias circuit 100 in the data read out from the memory cell transistor in which [L] data is stored, in the case of all patterns of voltage impression on metal wire ML0~metal wire ML5 shown in FIGS. 5~9.

Similarly, line BLH shows the voltage level of metal wire ML3 (main bit line D2) connected to the memory cell transistors in which [H] data is stored, in the case of all patterns of voltage impression on metal wire ML0-metal wire ML5 shown in FIGS. 1, 2, and 5~8. Similarly, line BLL shows the voltage level of metal wire ML3 (main bit line D2) that is connected to the memory cell transistor in which [L] data is stored, in the case of all patterns of voltage impression pattern on metal wire ML0~metal wire ML5 shown in FIGS. 5~8.

At time t0 (210 ns), address signal AD is input from an external circuit, and sense amplifier circuit 9 and a precharge circuit are activated by the signal from an address signal detecting circuit not shown in the figures. In other words, the control signal SEB input from an address signal detecting circuit, not shown in the figures, to terminal T1 of the aforementioned bias circuit 100 (FIG. 19) in sense amplifier circuit 9, becomes [L] level, and a specific bias voltage Vp is output to Y selector 7 via terminal T3. Similarly, precharge circuit 8 outputs a precharge signal PC to Y selector 7.

Next, at time t1 (215 ns), Y decoder 2 decodes the address signal AD that was inputted and held in address buffer 11, and outputs Y selection signal YG to Y selector 7. When reading out memory cell transistor M0 based on the inputted Y selection signal YG, for example, Y selector 7 initiates a charge by providing a specific bias voltage Vp from sense amplifier circuit 9 to metal wire ML3 (main bit line D2), and initiates a charge by applying the precharge signal PC from precharge circuit 8 onto metal wire ML5 (main bit line D3), as shown by the voltage impression pattern on metal wire ML0~metal wire ML5 in FIG. 5. As a result, metal wire ML1 (main bit line D1) is placed in the OPEN state.

Similarly, based on the inputted address signal AD, virtual GND selector 5 initiates a charge by applying a specific bias voltage Vp to metal wire ML4 (virtual main grounding line V3), and grounds metal wire ML2 (virtual main grounding line V2), for example, as shown by the voltage impression pattern on metal wire ML0~metal wire ML5 in FIG. 5. As a result, metal wire ML0 (virtual main grounding line V1) is placed in the OPEN state.

As a result, metal wire ML3 (main bit line D2) is adjacent to metal wire ML2 (virtual main grounding line V2), which has a specific bias voltage Vp, and grounded metal wire ML4 (virtual main grounding line V3) (the first impression pattern, second impression pattern, third impression pattern, and fourth impression pattern in the first embodiment of the present invention). Metal wire ML3 (main bit line D2) is affected by crosstalk noise when the adjacent metal wire ML4 (virtual main grounding line V3) rises.

As a result, the voltage level of lines BLH and BLL shown in FIG. 9, i.e., the potential of metal wire ML3 (main bit line D2), starts to rise. Simultaneously, the voltage level of lines BH and BL, i.e., the voltage level of the output signal Dout from bias circuit 100, gradually decreases since current is supplied to metal wire ML3 (main bit line D2).

Next, at time t2 (218 ns), based on address signal AD, bank recoder 3 outputs bank selection signal BS0 and bank selection signal BS4 to bank selector 6A at [H] level, and outputs the other bank selection signals BS1, BS2, BS3 and BS5 to bank selector 6C at [L] level.

As a result, metal wire ML0 (virtual main grounding line V1) is connected to virtual sub-grounding line Q02, metal wire ML1 (main bit line D1) is connected to sub-bit line Q00, metal wire ML2 (virtual main grounding line V2) is connected to virtual sub-grounding line Q12, metal wire ML3 (main bit line D2) is connected to sub-bit line Q10, metal wire ML4 (virtual main grounding line V3) is connected to virtual sub-grounding line Q22, and metal wire ML5 (main bit line D3) is connected to sub-bit line Q20. The precharge on metal wire ML3 (main bit line D2) from bias circuit 100 is terminated, current is supplied from voltage source Vcc, the voltage level of output signal Dout starts to rise, and the voltage level of metal wire ML3 (main bit line D2) continuously rises.

Next, at time t3 (222 ns), based on address signal AD, X decoder 4 sets the word selection line WD2 to [H] level. Memory cell transistor M0 is selected and the data stored in memory cell transistor M0 is read out. Bias circuit 100 shows the change in line BH if [H] data is written in the memory cell transistor, and shows the change in line BL if [L] data is written in the memory cell transistor.

Next, at time t4 (231 ns), a comparison with the reference voltage level is enabled at the differential amplifying circuit in sense amplifier circuit 9. In other words, this differential amplifying circuit begins sensing the current flowing to memory cell transistor M0. As a result, the [H]/[L] detection of the data stored in memory cell transistor M0 is enabled.

Next, at time t5 (232 ns), the voltage level of reference signal RG and the voltage level of metal wire ML3 (main bit line D2) assume a difference at which a comparison is possible. Sense amplifier circuit 9 outputs the results of the [H]/[L] detection for the data stored in memory cell transistor M0. In FIG. 9, time t5 is [232 ns].

Next, when reading out memory cell transistor M1, a charge is initiated by applying a specific bias voltage Vp from sense amplifier circuit 9 to metal wire ML3 (main bit line D2), and a charge is initiated by applying the precharge signal PC from precharge circuit 8 to metal wire ML1 (main bit line D1), as shown by the voltage impression pattern on metal wire ML0~metal wire ML5 in FIG. 6. As a result, metal wire ML5 (main bit line D3) is placed in the OPEN state.

Similarly, based on input address signal AD, virtual GND selector 5 initiates a charge by applying a specific bias voltage Vp to metal wire ML4 (virtual main grounding line V3), and grounds metal wire ML2 (virtual main grounding line V2), for example, as shown by the voltage impression pattern on metal wire ML0~metal wire ML5 in FIG. 6. As a result, metal wire ML0 (virtual main grounding line V1) is placed in the OPEN state. As a result, metal wire ML3 (main bit line D2) is adjacent to grounded metal wire ML2 (virtual main grounding line V2) and metal wire ML4 (virtual main grounding line V3) which is charged to a specific bias voltage Vp.

Thus, when reading out data stored in memory cell transistor M1, the voltage impression pattern for metal wire ML0~metal wire ML5 is equivalent to the case where reading out data stored in memory cell transistor M0. Metal wire ML3 is affected by crosstalk noise in the case where adjacent metal wire ML4 (virtual main grounding line V3) is rising that is equivalent to the case for the voltage impression pattern shown in FIG. 5.

Next, at time t2 (218 ns), based on address signal AD, bank recoder 3 outputs bank selection signal BS2 and bank selection signal BS3 to bank selector 6A at [H] level, and outputs the other bank selection signals BS0, BS1, BS4 and BS5 to bank selector 6C at [L] level.

As a result, metal wire ML0 (virtual main grounding line V1) is connected to virtual sub-grounding line Q05, metal wire ML1 (main bit line D1) is connected to sub-bit line Q04, metal wire ML2 (virtual main grounding line V2) is connected to virtual sub-grounding line Q15, metal wire ML3 (main bit line D2) is connected to sub-bit line Q14, metal wire ML4 (virtual main grounding line V3) is connected to virtual sub-grounding line Q25, and metal wire ML5 (main bit line D3) is connected to sub-bit line Q24. The precharge on metal wire ML3 (main bit line D2) from bias circuit 100 is terminated, current is supplied from voltage source Vcc, the voltage level of output signal Dout starts to rise, and the voltage level of metal wire ML3 (main bit line D2) continuously rises.

Next, at time t3 (222 ns), based on address signal AD, X decoder 4 sets the word selection line WD2 to [H] level. Memory cell transistor M1 is selected and the data stored in memory cell transistor M1 is read out. Bias circuit 100 shows the change in line BH if [H] data is written in memory cell transistor M1, and shows the change in line BL if [L] data is written in the memory cell transistor M1.

Next, at time t4 (231 ns), a comparison with the reference voltage level is enabled at the differential amplifying circuit in sense amplifier circuit 9. In other words, this differential amplifying circuit begins sensing the current flowing to memory cell transistor M1. As a result, the [H]/[L] detection of the data stored in memory cell transistor M1 is enabled.

Further, as in the case where reading out memory cell transistor M0 and memory cell transistor M1, when reading out the data stored in memory cell transistor M2, charging is performed by applying a specific bias voltage Vp to metal wiring ML4 (virtual main grounding line V3), grounding metal wire ML2 (virtual main grounding line V2), and placing metal wire ML0 (virtual main grounding line V1) in the OPEN state. As a result, metal wire ML3 (main bit line D2) is adjacent to metal wire ML4 (virtual main grounding line V3), which has been charged to a specific bias voltage Vp, and metal wire ML2 (virtual main grounding line V2), which is grounded. Accordingly, metal wire ML3 (main bit line D2) is affected by crosstalk noise when the adjacent metal wire ML4 (virtual main grounding line V3) rises in the same manner as in the case of the other voltage impression patterns shown in FIGS. 5 and 6.

The impression pattern shown in FIG. 8 is different from the other impression patterns shown in FIGS. 5~7. Namely, metal wire ML4 (virtual main grounding line V3), which is adjacent to metal wire ML3 (main bit line D2), is grounded, and metal wire ML2 (virtual main grounding line V2) is charged to a specific voltage Vp. However, because metal wire ML3 (main bit line D2) is affected by crosstalk noise from the neighboring metal wire ML2 (virtual main grounding line V2), it may be considered to have the same voltage impression pattern as the other voltage impression patterns shown in FIGS. 5~7.

Next, at time t2 (218 ns), based on address signal AD, bank recoder 3 outputs bank selection signal BS1 and bank selection signal BS4 to bank selector 6A at [H] level, and outputs the other bank selection signals BS0, BS2, BS3 and BS5 to bank selector 6C at [L] level.

As a result, metal wire ML0 (virtual main grounding line V1) is connected to virtual sub-grounding line Q02, metal wire ML1 (main bit line D1) is connected to sub-bit line Q01, metal wire ML2 (virtual main grounding line V2) is connected to virtual sub-grounding line Q12, metal wire ML3 (main bit line D2) is connected to sub-bit line Q11, metal wire ML4 (virtual main grounding line V3) is connected to virtual sub-grounding line Q22, and metal wire ML5 (main bit line D3) is connected to sub-bit line Q21. The precharge on metal wire ML3 (main bit line D2) from bias circuit 100 is terminated, current is supplied from voltage source Vcc, the voltage level of output signal Dout starts to rise, and the voltage level of metal wire ML3 (main bit line D2) continuously rises.

Next, at time t3 (222 ns), based on address signal AD, X decoder 4 sets the word selection line WD2 to [H] level. Memory cell transistor M3 is selected and the data stored in memory cell transistor M3 is read out. Bias circuit 100 shows the change in line BH if [H] data is written in memory cell transistor M3, and shows the change in line BL if [L] data is written in the memory cell transistor M3.

Next, at time t4 (231 ns), a comparison with the reference voltage level is enabled at the differential amplifying circuit in sense amplifier circuit 9. In other words, this differential amplifying circuit begins sensing the current flowing to memory cell transistor M3. As a result, the [H]/[L] detection of the data stored in memory cell transistor M3 is enabled.

As described above, in the semiconductor memory device according to the first embodiment of the present invention, when one of either metal wire ML2 (virtual main grounding line V2) and metal wire ML4 (virtual main grounding line V3) which are adjacent to metal wire ML3 (main bit line D2) is grounded, then the other metal wire not grounded enters a state in which it is precharged to a specific bias voltage Vp without fail, in the case where reading out data stored in any memory cell transistor in memory cell array 6B.

For this reason, where reading out data stored in any memory cell transistor of memory cell array 6B, when the potential of metal wire ML3 (main bit line D2) is rising, due to the adjacent metal wire ML4 (virtual main grounding line V3) increasing toward a specific bias voltage Vp for example, metal wire ML3 (main bit line D2) and metal wire ML4 (virtual main grounding line V3) are mutually affected by crosstalk noise due to the coupling capacity therebetween.

Accordingly, metal wire ML3 (main bit line D2) achieves a voltage forced up by crosstalk noise. Accordingly, the value shown by line BLH indicating the potential of metal wire ML3 (main bit line D2) when storing [H] level data and the value shown by line BLL indicating the potential of metal wire ML3 (main bit line D2) when storing [L] level data becomes the same for all voltage impression patterns shown in FIGS. 5~8, respectively. In addition, in all the voltage impression patterns shown in FIGS. 5~8, the change in the potential of lines BLH and BLL are equivalent. For this reason, output signal Dout of bias circuit 100 is the same in the case where reading out data from the memory cell transistors in memory cell array 6B as shown in FIG. 9.

A MOS transistor, not present in the conventional art, for controlling the current direction is provided to bank selector 6A and bank selector 6C of the semiconductor memory device according to the first embodiment. For this reason, the direction of the current flowing to the selected memory cell transistor can be freely controlled when selecting and reading out data from any memory cell transistor in memory cell array 6B. Thus, control virtual GND selector 5 can equalize the voltage impression patterns for metal wire ML4 (virtual main grounding line V3) and metal wire ML2 (virtual main grounding line V2) that are adjacent to the metal wire ML3 (main bit line D2) connected to sense amplifier circuit 9.

The semiconductor memory device according to the first embodiment can establish the equivalent state for the crosstalk noise that is applied to metal wire ML3 (main bit line D2) connected to sense amplifier circuit 9 when metal wire ML4 (virtual main grounding line V3) and metal wire ML2 (virtual main grounding line V2) are charged to a specific bias voltage Vp, for any memory cell transistor selected in memory cell array 6B.

Thus, the crosstalk noise effect from metal wire ML2 (virtual main grounding line V2) and metal wire ML4 (virtual main grounding line V3) that are adjacent to metal wire ML3 (main bit line D2) is the same when selecting and reading out data from any memory cell transistor in memory cell array 6B. For this reason, with regard to the voltage of the reference signal RG supplied from reference circuit 10, the output of other bias circuits 101 used for reference may be set to a value that is intermediate between line BH and line BL of output signal Dout shown in FIG. 9, i.e., a value that is in the middle of line BLH and line BLL.

As a result, there is no reduction in the margin for setting the voltage of the reference signal RG as occurred in the conventional example due to the fact that the voltage impression patterns on metal wire ML0~metal wire ML5 were different. Accordingly, it is possible to realize a faster time for data read out. In the results of a SPICE simulation, the access time for data read out in a conventional semiconductor memory device was [26 ns] at [236 ns–210 ns], while the access time for data read out in the semiconductor memory device according to the first embodiment of this invention was [22 ns] at [232 ns–210 ns], an improvement of 4 ns.

In addition, the margin for setting the voltage of reference signal RG in the semiconductor memory device according to the first embodiment of the present invention is large as compared to the conventional example. As a result, the dispersion in the access time for each semiconductor memory device due to change in the threshold value of the memory cell transistor is reduced.

The present invention's first embodiment was explained in detail above with reference to the figures, however, its specific design is not limited to this embodiment. Rather, design modifications that do not depart from the essential gist of the invention are also included herein.

Figure 10:
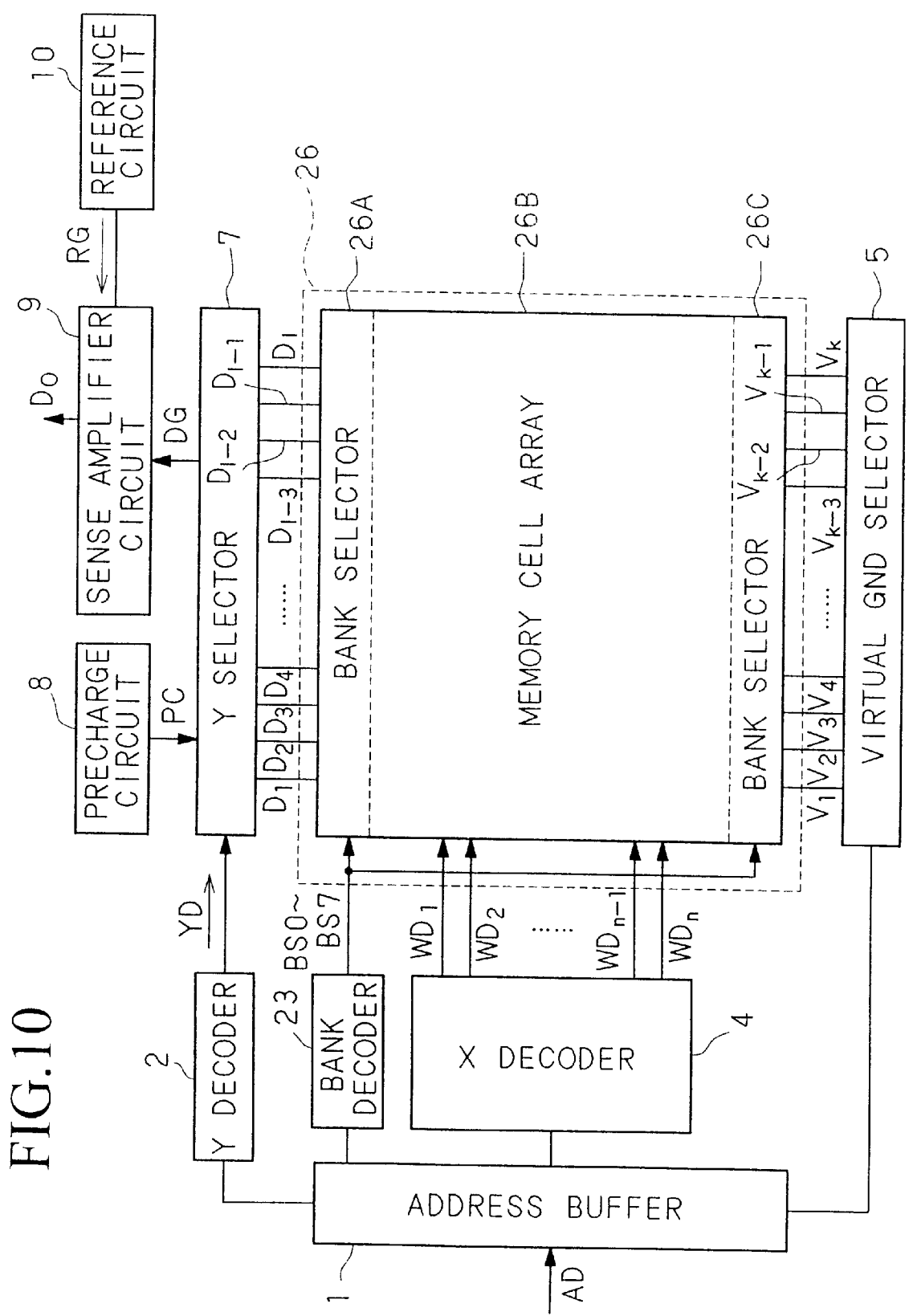
FIG. 10 is a block diagram showing the structure of a semiconductor memory device according to a second embodiment of the present invention.

For example, a semiconductor memory device structure according to the second embodiment shown in FIG. 10 is also possible. In this figure, structures other than bank decoder 23 and memory cell 26 are equivalent to the first embodiment, so that an explanation thereof is omitted here.

Figure 11:
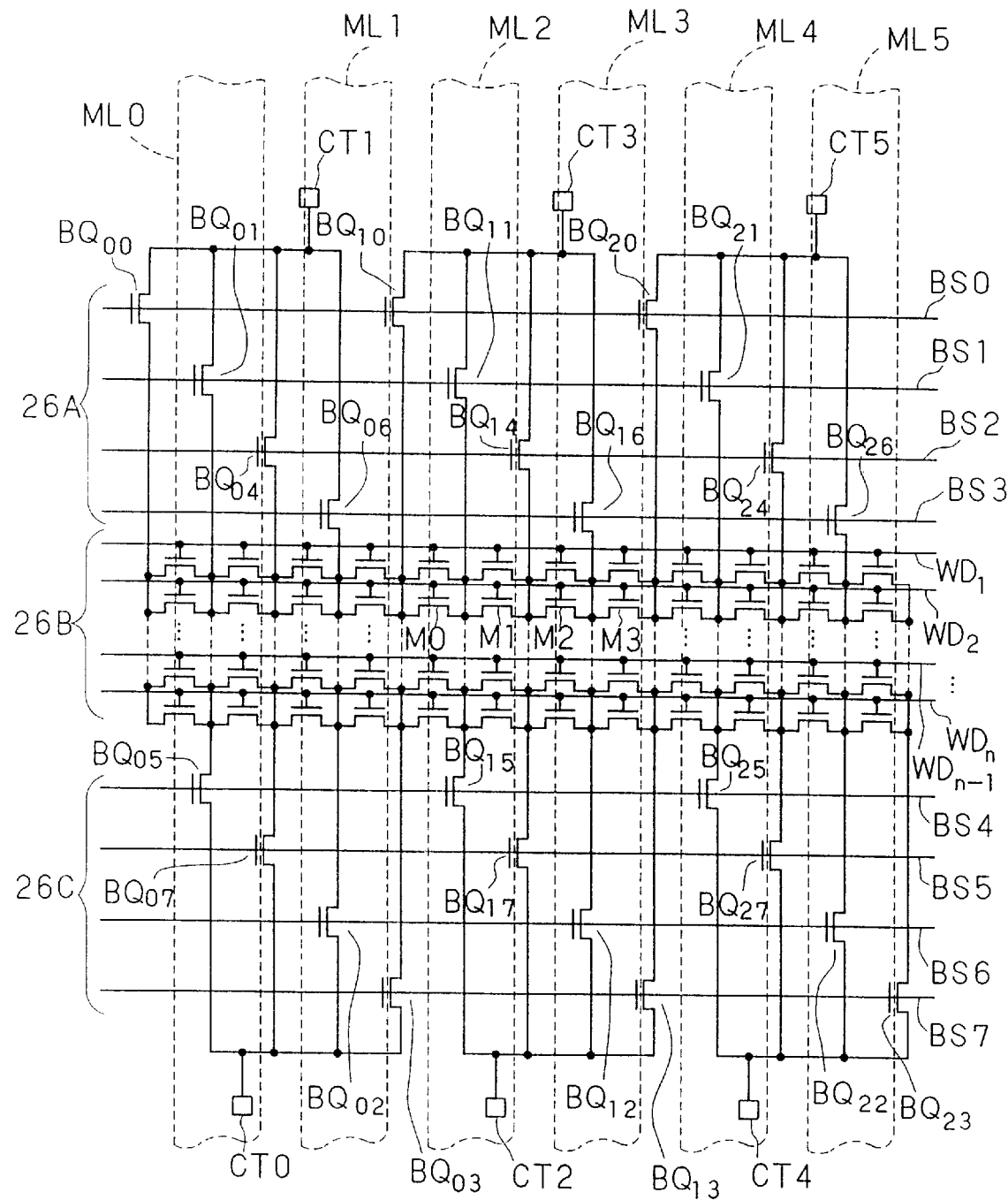
FIG. 11 is a conceptual diagram showing the structure of memory cell 26 in the semiconductor memory device of FIG. 10.
Figure 13:
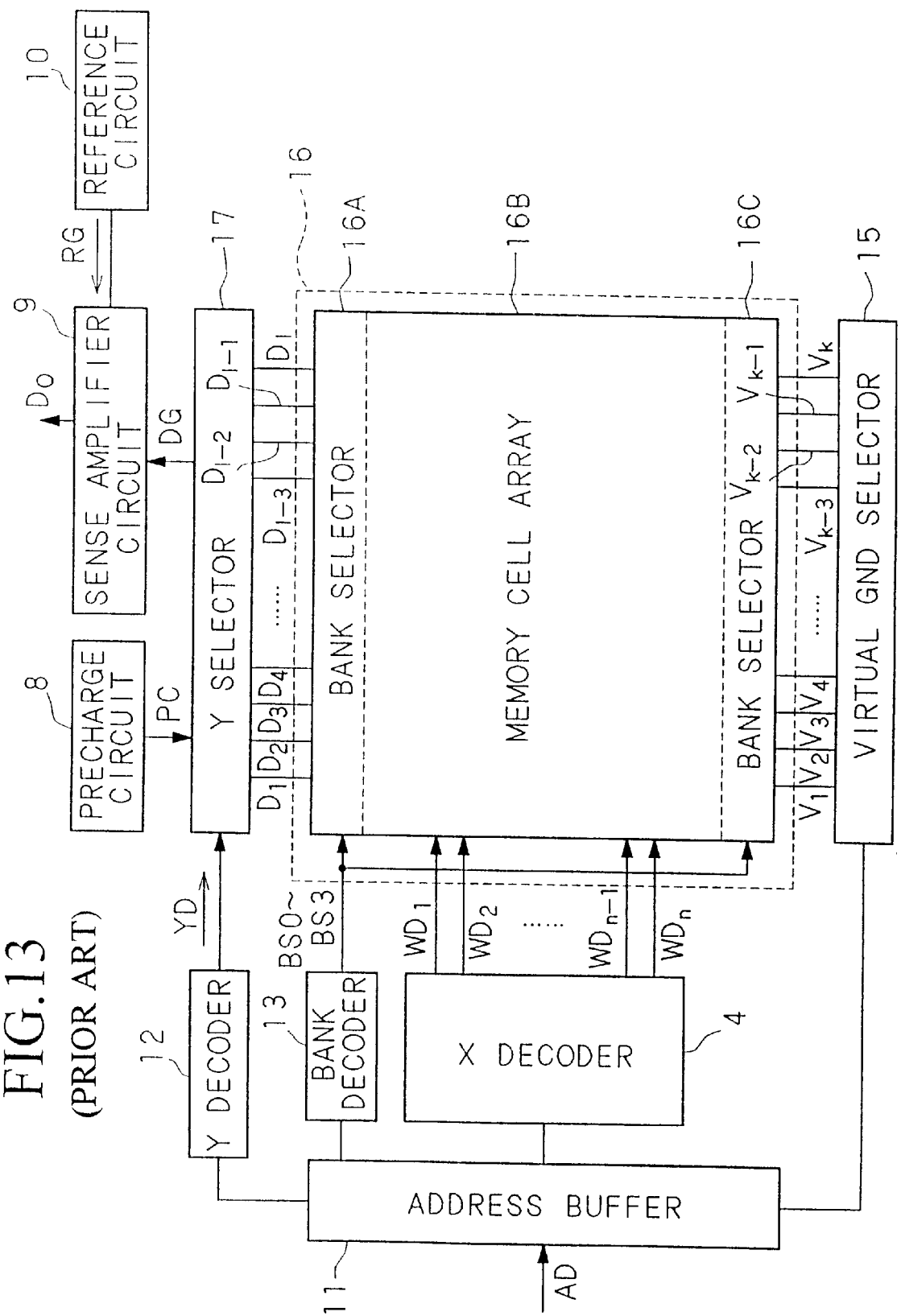
FIG. 13 is a block diagram showing the structure of a semiconductor memory device according to the conventional art.
Figure 14:
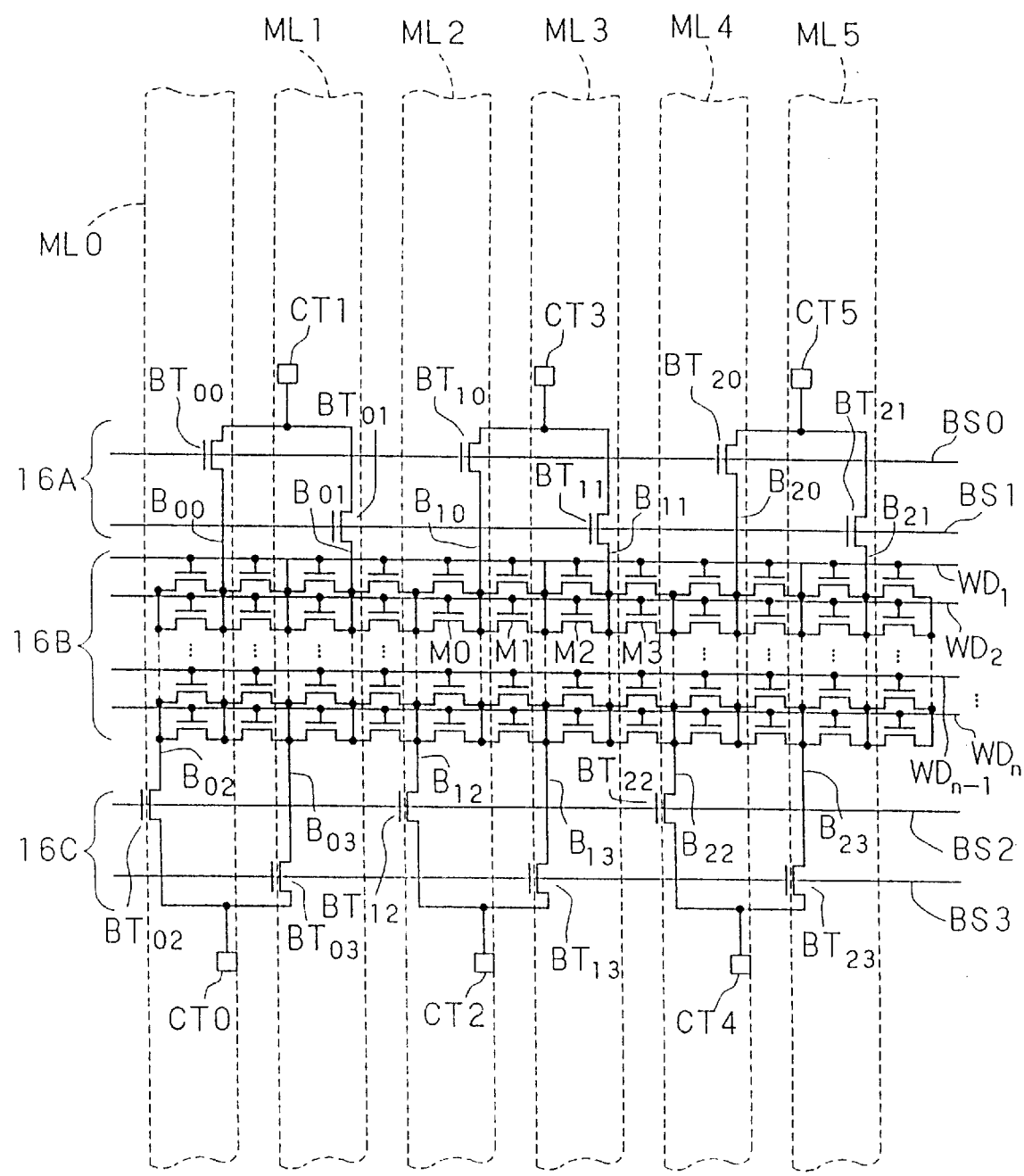
FIG. 14 is a conceptual diagram showing the structure of memory cell 16 in the semiconductor memory device of FIG. 13.
Figure 15:
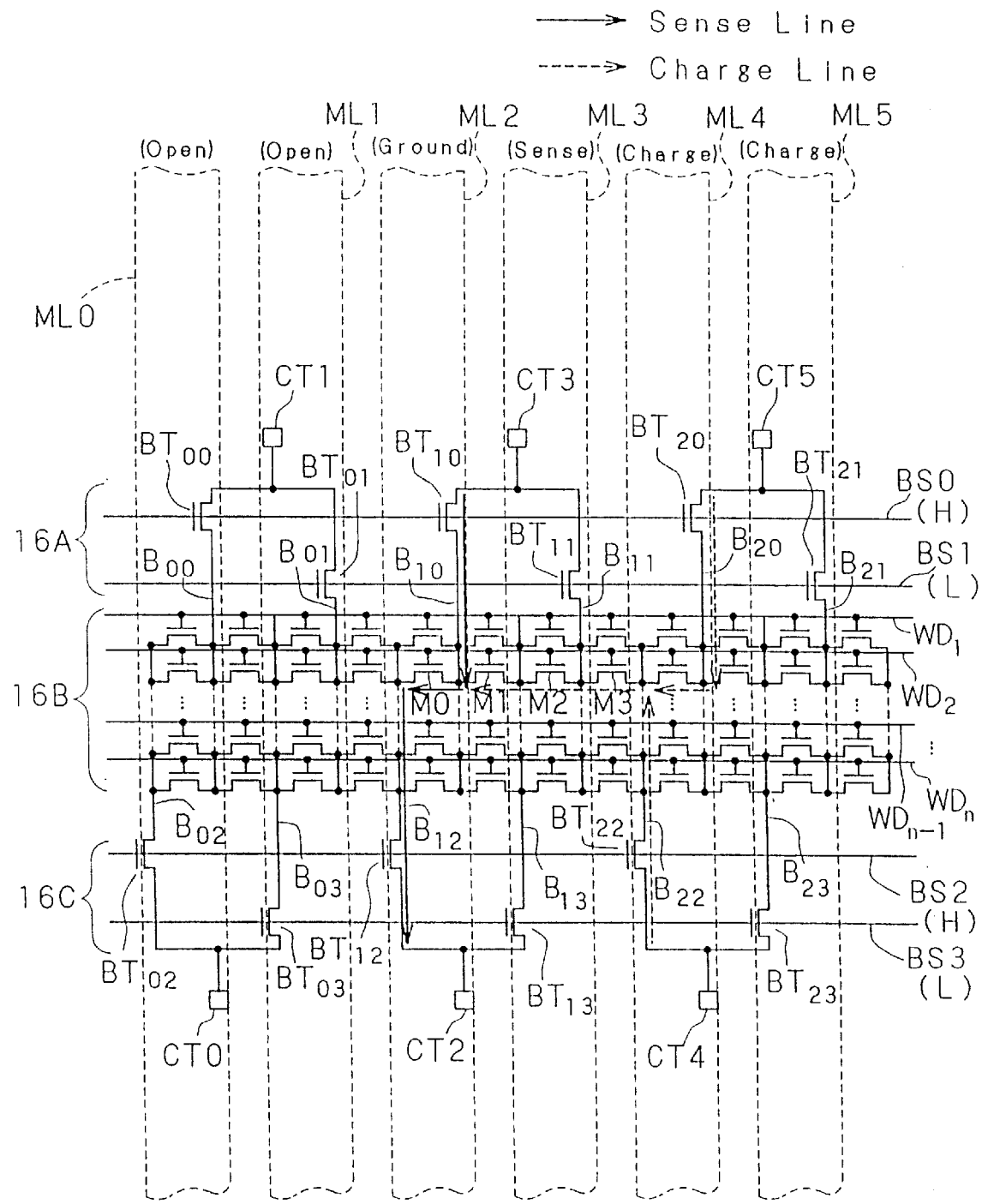
FIG. 15 is a diagram showing the voltage impression pattern for metal wire ML0~metal wire ML5 when the data stored in memory cell transistor M0 in memory cell 16 shown in FIG. 14 is read out.
Figure 16:
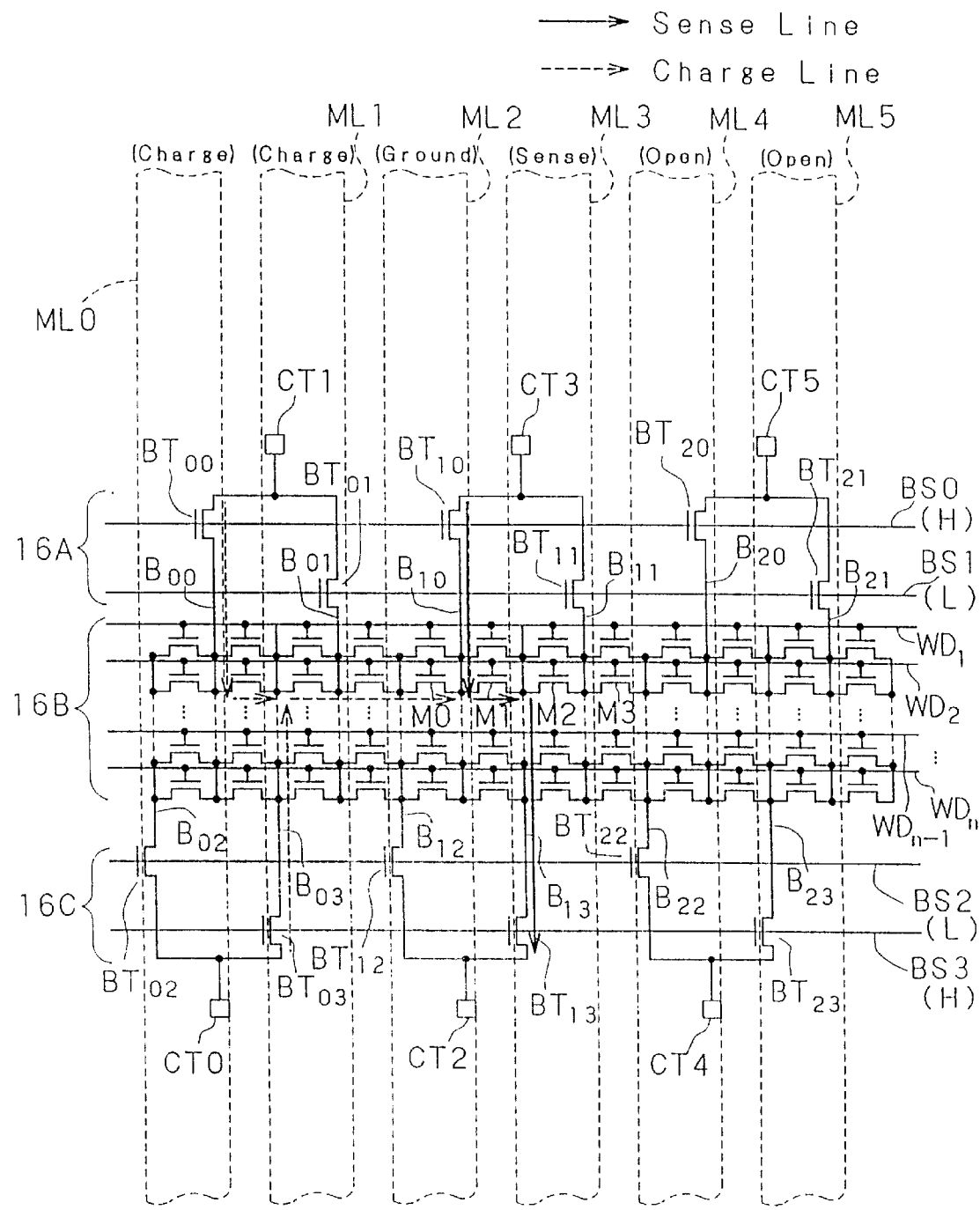
FIG. 16 is a diagram showing the voltage impression pattern for metal wire ML0~metal wire ML5 when the data stored in the memory cell transistor M1 in memory cell 16 shown in FIG. 14 is read out.
Figure 17:
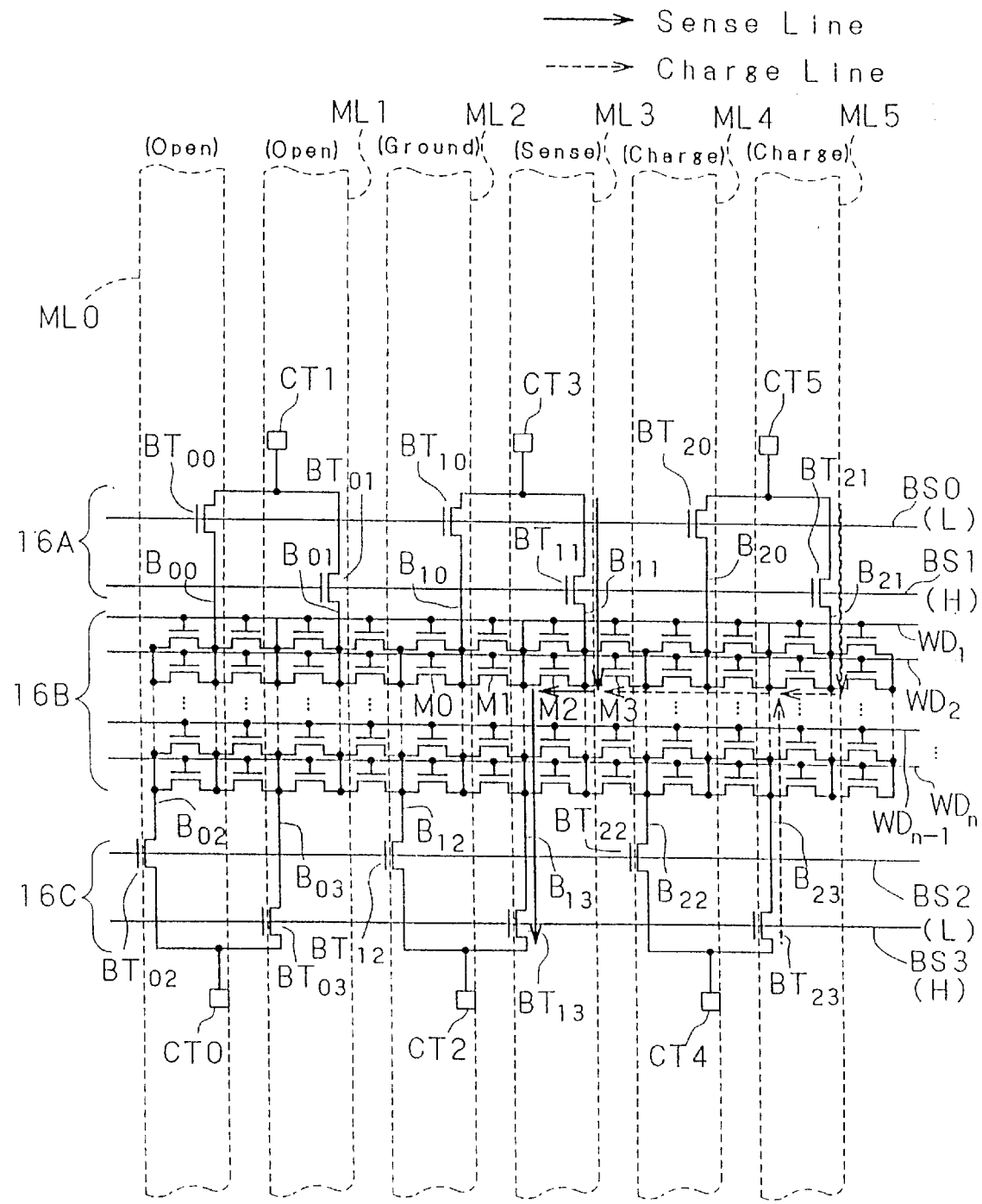
FIG. 17 is a diagram showing the voltage impression pattern for metal wire ML0~metal wire ML5 when the data stored in the memory cell transistor M2 in memory cell 16 shown in FIG. 14 is read out.
Figure 18:
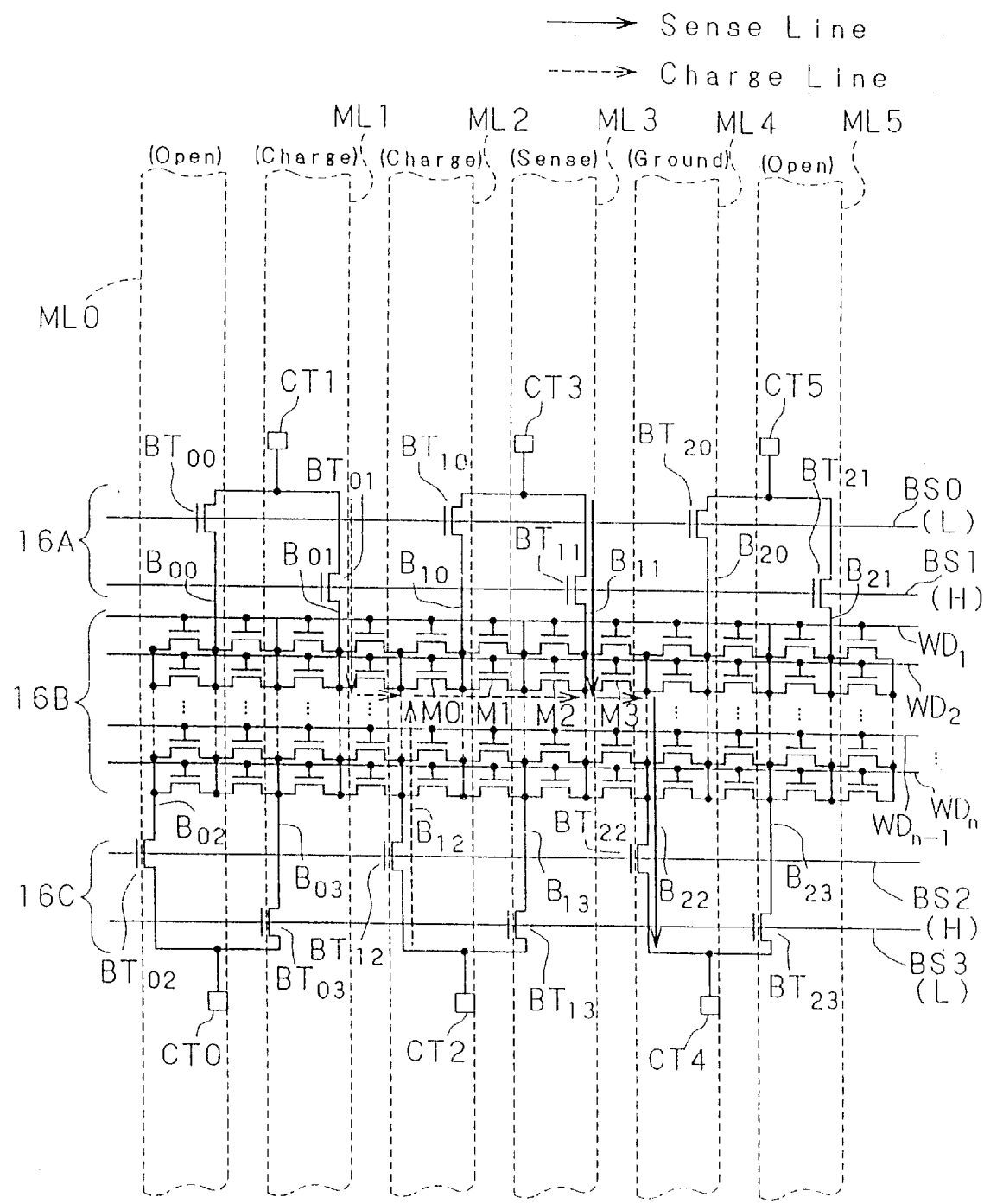
FIG. 18 is a diagram showing the voltage impression pattern for metal wire ML0~metal wire ML5 when the data stored in the memory cell transistor M3 in memory cell 16 shown in FIG. 14 is read out.

Parts which differ from the first embodiment will be explained using FIG. 11. FIG. 11 is a conceptual diagram showing the structure of memory cell 26 in the semiconductor memory device in FIG. 10. The specific structure is equivalent to the first embodiment. However, in contrast to bank decoder 6A and bank decoder 6B, the MOS transistor for controlling current flow has been increased at the bank decoder 26A and bank decoder 26B in the second embodiment.

In other words, MOS transistor BQ06, MOS transistor BQ07, MOS transistor BQ16, MOS transistor BQ17, MOS transistor BQ26, and MOS transistor BQ27 have been added as current control MOS transistors. Thus, bank decoder 23 controls the added MOS transistors, and outputs bank selection signal BS0~bank selection signal BS7 to bank selector 26A and bank selector 26C respectively, in accordance with the truth values shown in the table in FIG. 12.

The names of each of the selected memory cell transistors is shown in the left column of the table shown in FIG. 12. For example, when memory cell transistor M0 is selected according to address signal AD, bank decoder 23 sets bank selection signal BS0 to [H] level, bank selection signal BS1 to [L] level, bank selection signal BS2 to [L] level, bank selection signal BS3 to [L] level, bank selection signal BS4 to [H] level, bank selection signal BS5 to [L] level, bank selection signal BS6 to [L] level, and bank selection signal BS7 to [L] level, and outputs these to bank selector 26A and bank selector 26C respectively.

At this time, metal wire ML3 (main bit line D2) is connected to sense amplifier circuit 9 by Y selector 7. One adjacent metal wire ML2 (virtual main grounding line V2) is set as grounding potential GND, while the other adjacent metal wire ML4 (virtual main grounding line V3) is placed in the OPEN state by virtual GND selector 5. Virtual GND selector 5 charges metal wire ML0 (virtual main grounding line V1) to a specific bias voltage Vp. Y selector 7 charges metal wire ML1 (main bit line D1) to a specific bias voltage Vp, and places metal wire ML4 (main bit line D3) in the OPEN state.

Accordingly, since bank selection signal BS0 and bank selection signal BS4 are at [H] level, the drain of memory cell transistor M0 is connected to metal wire ML3 (main bit line D2) via MOS transistor BQ10, while the source of memory cell transistor M0 is connected to metal wire ML2 (virtual main grounding line V2) via MOS transistor BQ15. X decoder 4 sets word selection line WD2 to [H] level, so that the current from sense amplifier circuit 9 flows into memory cell transistor M0 only. As a result, a determination of the data stored in memory cell transistor M0 is performed at sense amplifier circuit 9 through the same processing as carried out in the first embodiment.

As described above, each MOS transistor in bank selector 26A and bank selector 26C can freely control the direction of the current flowing into the memory cell transistor selected based on address signal AD. Thus, as in the first embodiment, control virtual GND selector 5 can equalize the voltage impression pattern for metal wire ML2 (virtual main grounding line V2) and metal wire ML4 (virtual main grounding line V3) that are adjacent to metal wire ML3 (main bit line D2) that is connected to sense amplifier circuit 9. In other words, where reading out data stored in any one of the memory cell transistors in memory cell array 26B, when one of either metal wire ML4 (virtual main grounding line V3) and metal wire ML2 (virtual main grounding line V2) that are adjacent to metal wire ML3 (main bit line D2) is grounded, then the other metal wire that is not grounded enters a state in which it is charged to a specific bias voltage Vp without fail.

Accordingly, as in the first embodiment, in the semiconductor memory device according to the second embodiment, where reading out data stored in any memory cell transistor in memory cell array 26B, when the potential of metal wire ML3 (main bit line D2) is rising, the adjacent metal wire ML4 (virtual main grounding line V3) also rises toward the specific bias voltage Vp. Thus, due to the coupling capacity between metal wire ML3 (main bit line D2) and metal wire ML4 (virtual main grounding line V3), a mutual crosstalk noise effect results.

For this reason, results equivalent to those obtained for the first embodiment are obtained when a SPICE simulation of read out of data stored in the memory cell transistor in the semiconductor memory device according to the second embodiment is performed. Accordingly, the effects of this invention are equivalent to those of the first embodiment, so that a detailed explanation thereof is omitted here.

What is claimed is:

1. A semiconductor memory device comprising:
a plurality of main bit lines;
a main bit line controller for controlling whether to impress a specific voltage on the main bit lines, connect the main bit lines to a sense amplifier, or place the main bit lines in the OPEN state, based on an address signal;
a plurality of virtual main grounding lines; and
a virtual main grounding line controller for controlling whether to impress a specific voltage on the virtual main grounding lines, impress a grounding voltage on the virtual main grounding lines, or place the virtual main grounding lines in the OPEN state, based on the address signal;
wherein, said main bit line controller and said virtual main grounding line controller control the voltage impression states of the main bit lines and the virtual main grounding lines respectively, so that, when accessing a memory cell, the relative positional relationship of the voltage level states of said virtual main grounding lines and other main bit lines that are adjacent to and at specific intervals of space from said main bit line connecting the selected memory cell and said sense amplifier, will be the same for any memory cell selected.

2. A semiconductor memory device according to claim 1, further comprising a plurality of sub-bit lines connected to said main bit lines via transistors, and connected to the memory cells, respectively; and a plurality of sub-grounding lines connected to said virtual main grounding lines via other transistors, and connected to the memory cells, respectively; wherein said sub-bit lines and said sub-grounding lines are formed via connection therebetween.

3. A semiconductor memory device according to claim 2, wherein said sub-bit lines and said sub-grounding lines are formed via connection therebetween, these sub-bit lines and said transistors provided respectively thereto being provided for controlling the directions of the current flowing to said memory cells.

4. A semiconductor memory device according to claim 3, further comprising a memory cell selection controller for selecting the memory cell corresponding to the address signal and controlling the direction of current flowing to this memory cell by making it correspond with the voltage state of said main bit line and said virtual main grounding line, by performing ON/OFF control of said transistors and said other transistors, based on an inputted address signal.

5. A semiconductor memory device according to claim 3, wherein the wiring patterns for said main bit lines and said virtual main grounding lines are formed to alternate.

6. A semiconductor memory device according to claim 3, wherein said memory cells are formed of MOS transistors, and data are stored by changing the threshold voltages for controlling the ON/OFF states of these MOS transistors.

7. A semiconductor memory device according to claim 2, wherein the wiring patterns for said main bit lines and said virtual main grounding lines are formed to alternate.

8. A semiconductor memory device according to claim 2, wherein said memory cells are formed of MOS transistors, and data are stored by changing the threshold voltages for controlling the ON/OFF states of these MOS transistors.

9. A semiconductor memory device according to claim 2, wherein said sub-bit lines and said sub-grounding lines are formed via connection therebetween, these sub-grounding lines and said other transistors provided respectively thereto being provided for controlling the directions of the current flowing to said memory cells.

10. A semiconductor memory device according to claim 9, further comprising a memory cell selection controller for selecting the memory cell corresponding to the address signal and controlling the direction of current flowing to this memory cell by making it correspond with the voltage state of said main bit line and said virtual main grounding line, by performing ON/OFF control of said transistors and said other transistors, based on an inputted address signal.

11. A semiconductor memory device according to claim 9, wherein the wiring patterns for said main bit lines and said virtual main grounding lines are formed to alternate.

12. A semiconductor memory device according to claim 9, wherein said memory cells are formed of MOS transistors, and data are stored by changing the threshold voltages for controlling the ON/OFF states of these MOS transistors.

13. A semiconductor memory device according to claim 2, further comprising a memory cell selection controller for selecting the memory cell corresponding to the address signal and controlling the direction of current flowing to this memory cell by making it correspond with the voltage state of said main bit line and said virtual main grounding line, by performing ON/OFF control of said transistors and said other transistors, based on an inputted address signal.

14. A semiconductor memory device according to claim 13, wherein the wiring patterns for said main bit lines and said virtual main grounding lines are formed to alternate.

15. A semiconductor memory device according to claim 13, wherein said memory cells are formed of MOS transistors, and data are stored by changing the threshold voltages for controlling the ON/OFF states of these MOS transistors.

16. A semiconductor memory device according to claim 1, wherein the wiring patterns for said main bit lines and said virtual main grounding lines are formed to alternate.

17. A semiconductor memory device according to claim 16, wherein said memory cells are formed of MOS transistors, and data are stored by changing the threshold voltages for controlling the ON/OFF states of these MOS transistors.

18. A semiconductor memory device according to claim 1, wherein said memory cells are formed of MOS transistors and data are stored by changing the threshold voltages for controlling the ON/OFF states of these MOS transistors.

19. A method for reading out data stored in memory cells, comprising:

a main bit line control process wherein a main bit line controller controls the voltage impression states of a plurality of main bit lines so that the voltage level states of the main bit lines adjacent to and separated by specific intervals of space from the main bit line that is connected to a selected memory cell connected to a sense amplifier, are the same for any memory cell selected; and a virtual main grounding line control process wherein a virtual main grounding line controller controls the voltage impression states of a plurality of virtual main grounding lines so that the voltage level states of the virtual main grounding lines adjacent to and separated by specific intervals of space from said main bit line that is connected to said selected memory cell connected to said sense amplifier, are the same for any memory cell selected.

20. A method for reading out data stored in memory cells according to claim 19, further comprising:

a process wherein a memory cell selection controller selects one of sub-bit lines connected to said main bit lines via respective transistors and one of sub-grounding lines connected to said virtual main grounding lines via other respective transistors by controlling the ON/OFF states of said transistors and said other transistors based on an inputted address signal, in order to control the direction of the current flowing to the memory cell corresponding to the address signal by making it correspond to the voltage state of the main bit line and the virtual main grounding line.

* * * * *